(12) United States Patent
Kondo et al.

(10) Patent No.: US 8,450,852 B2
(45) Date of Patent: May 28, 2013

(54) WIRING SUBSTRATE

(75) Inventors: Hitoshi Kondo, Nagano (JP); Tomoyuki Shimodaira, Nagano (JP); Masako Sato, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 69 days.

(21) Appl. No.: 13/114,417

(22) Filed: May 24, 2011

(65) Prior Publication Data

US 2011/0316148 A1  Dec. 29, 2011

(30) Foreign Application Priority Data

Jun. 24, 2010 (JP) .................... 2010-143862

(51) Int. Cl.
*H01L 23/12* (2006.01)
*H01L 23/053* (2006.01)
*H01L 23/14* (2006.01)
*H01L 23/48* (2006.01)
*H01L 23/52* (2006.01)
*H01L 29/40* (2006.01)

(52) U.S. Cl.
USPC ........... 257/758; 257/701; 257/702; 257/737; 257/E23.06

(58) Field of Classification Search
USPC .............. 257/701, 702, 737, 758, E23.06
See application file for complete search history.

(56) References Cited

U.S. PATENT DOCUMENTS

| | | | | |
|---|---|---|---|---|
| 6,143,116 A | * | 11/2000 | Hayashi et al. | 156/233 |
| 6,413,620 B1 | * | 7/2002 | Kimura et al. | 428/210 |
| 6,740,411 B2 | * | 5/2004 | Kojima et al. | 428/413 |
| 7,312,536 B2 | * | 12/2007 | Yamano et al. | 257/787 |
| 2003/0066683 A1 | * | 4/2003 | Suzuki et al. | 174/262 |
| 2004/0089471 A1 | * | 5/2004 | Andoh et al. | 174/262 |
| 2005/0218503 A1 | * | 10/2005 | Abe et al. | 257/700 |
| 2009/0236135 A1 | | 9/2009 | Ueda et al. | |
| 2011/0297425 A1 | * | 12/2011 | Nakamura et al. | 174/251 |

FOREIGN PATENT DOCUMENTS

| | | | | |
|---|---|---|---|---|
| JP | 2004-140385 | | 5/2004 | |
| JP | 2008214479 A | * | 9/2008 | |
| JP | 2009-76565 | | 4/2009 | |
| JP | 2009176889 A | * | 8/2009 | |
| JP | 2009-224739 | | 10/2009 | |
| JP | 2009272533 A | * | 11/2009 | |
| WO | WO03/039219 | | 5/2003 | |

* cited by examiner

*Primary Examiner* — Teresa M Arroyo
(74) *Attorney, Agent, or Firm* — IPUSA, PLLC

(57) ABSTRACT

A wiring substrate includes plural wiring layers and plural insulation layers being alternately stacked one on top of the other. The plural insulation layers are formed with insulation resin having the same composition. The plural insulation layers are formed with a filler having the same composition. The filler content of each of the plural insulation layers ranges from 30 vol % or more to 65 vol % or less. The thermal expansion coefficient of each of the plural insulation layers ranges from 12 ppm/° C. or more to 35 ppm/° C. or less.

14 Claims, 19 Drawing Sheets

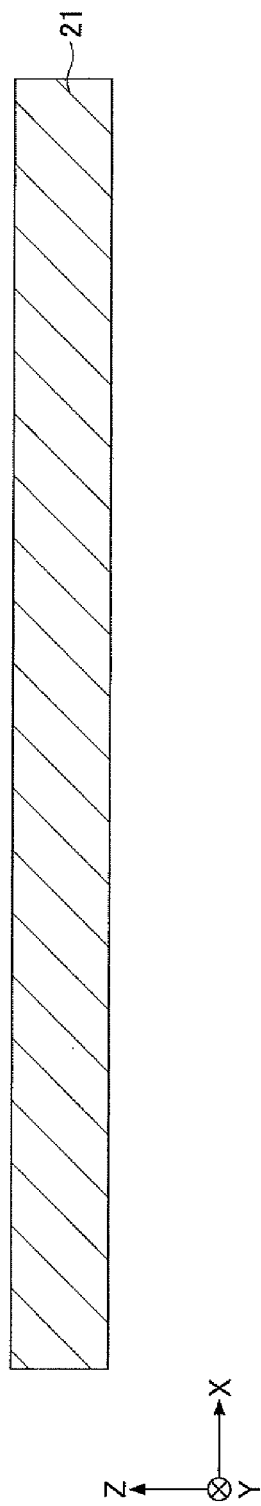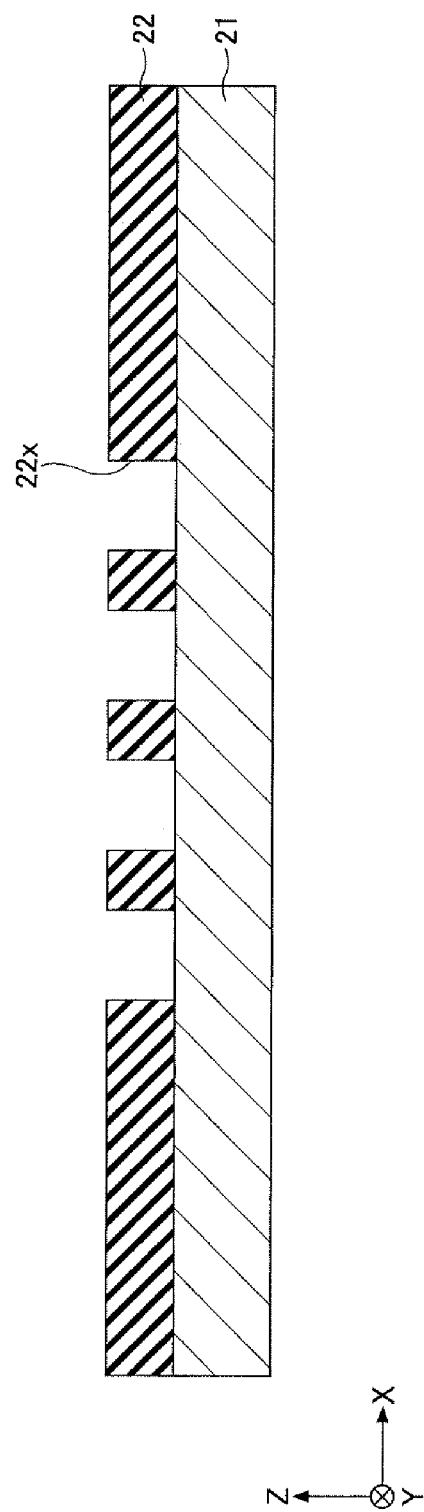

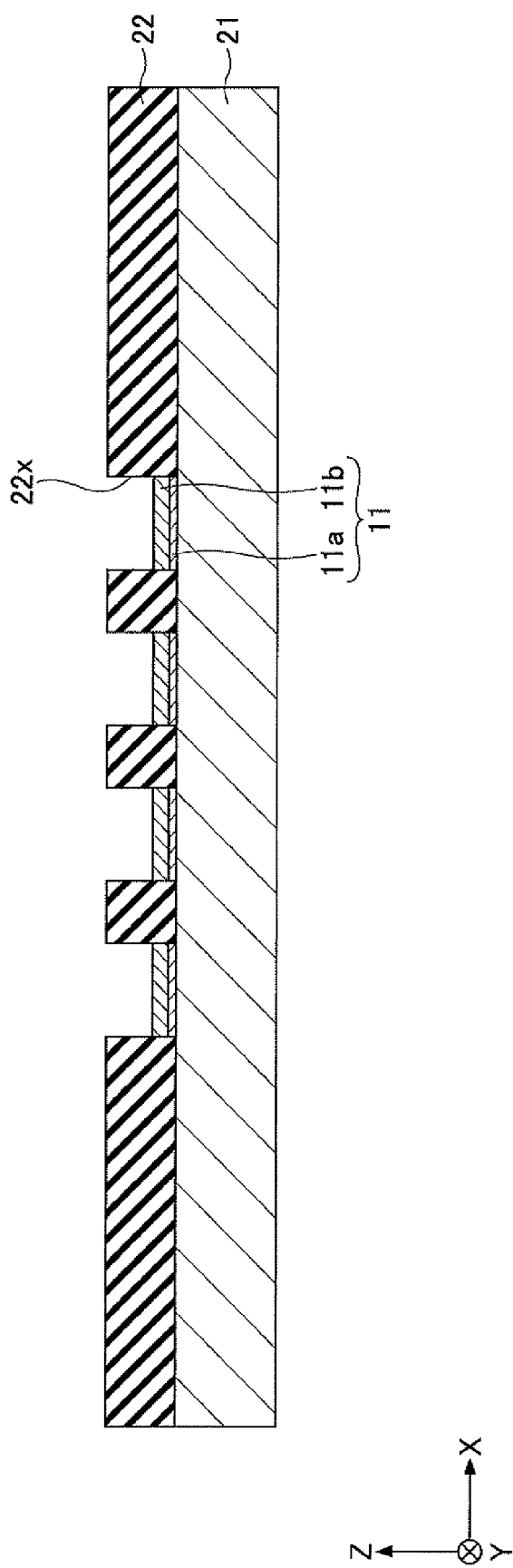

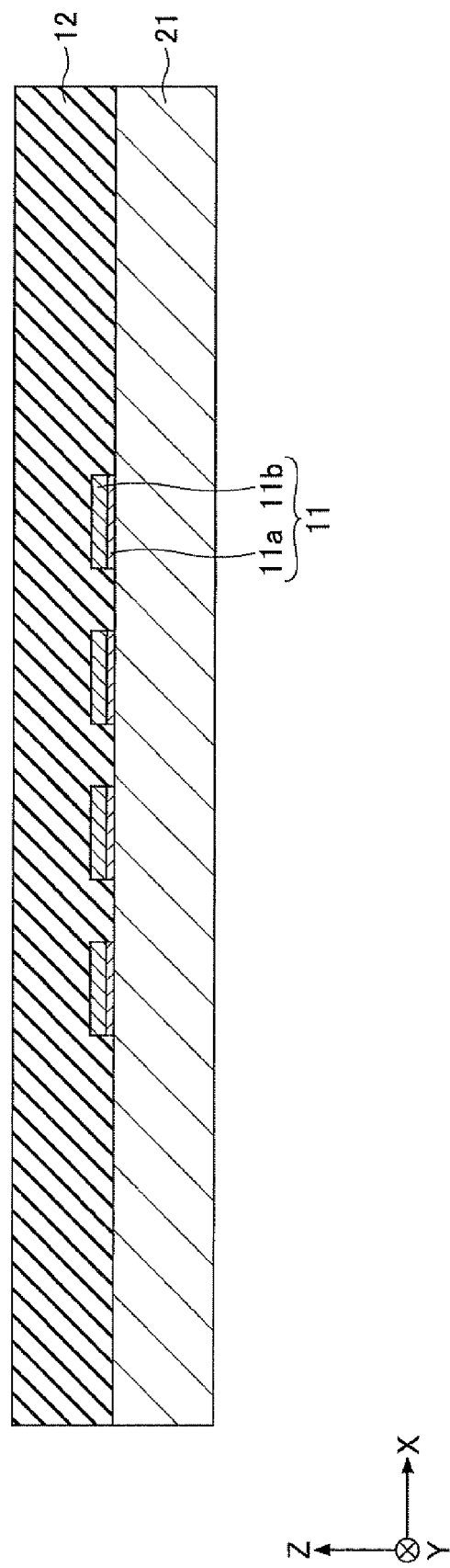

FIG.20
| | FILLER CONTENT [vol%] | THERMAL EXPANSION COEFFICIENT [ppm/°C] | WARPING IMAGE (TOP SIDE: CHIP MOUNTING SURFACE) | WARPING AMOUNT T [μm] |
|---|---|---|---|---|
| FIRST COMPARATIVE EXAMPLE | 23 | APPROX. 45 |  | −683.3 |
| SECOND COMPARATIVE EXAMPLE | 23 | APPROX. 45 |  | −673.6 |
| FIRST EXAMPLE | 30 | APPROX. 35 | 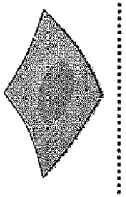 | −589.2 |
| SECOND EXAMPLE | 45 | APPROX. 25 | 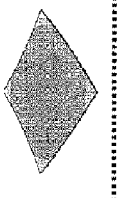 | −245.5 |
| THIRD EXAMPLE | 55 | APPROX. 17 |  | +8.7 |
| FOURTH EXAMPLE | 65 | APPROX. 12 | 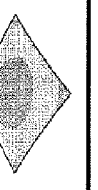 | +217.3 |

WIRING SUBSTRATE

CROSS-REFERENCE TO RELATED APPLICATIONS

This application is based upon and claims the benefit of priority of the prior Japanese Patent Application No. 2010-143862 filed on Jun. 24, 2010, the entire contents of which are incorporated herein by reference.

FIELD

The embodiments discussed herein are related to a wiring substrate having a stacked configuration including plural wiring layers and insulating layers.

BACKGROUND

FIG. 1 is a cross-sectional view of a wiring substrate 100 according to a related art example. With reference to FIG. 1, the wiring substrate 100 includes a first wiring layer 110, a first insulation layer 120, a second wiring layer 130, a second insulation layer 140, a third wiring layer 150, a third insulation layer 160, a fourth wiring layer 170, and a fourth insulation layer 180.

Each of the first wiring layer 110, the second wiring layer 130, the third wiring layer 150, and the fourth wiring layer 170 is formed of, for example, copper (Cu). Each of the first insulation layer 120, the second insulation layer 140, the third insulation layer 160, and the fourth insulation layer 180 is formed of, for example, an epoxy type insulation resin.

The first wiring layer 110 and the second wiring layer 130 are electrically connected via first via holes 120x. The second wiring layer 130 and the third wiring layer 150 are electrically connected via second via holes 140x. The third wiring layer 150 and the fourth wiring layer 170 are electrically connected via third via holes 160x.

A side surface of the first wiring layer 110 and an upper surface of the first wiring layer 110 (a first surface of the first wiring layer 110 that is connected to a via wiring of the second wiring layer) are covered by the first insulation layer 120. Parts of a bottom surface of the first wiring layer 110 (a second surface of the first wiring layer 110 located opposite to the first surface) are exposed at the first insulation layer 120. The exposed parts of the bottom surface of the first wiring layer 110 act as electrode pads for electrically connecting the wiring substrate 100 to a semiconductor chip or the like (not illustrated). Parts of the fourth wiring layer 170 are exposed at opening parts 180x formed in the fourth insulation layer 180. The exposed parts of the fourth wiring layer 170 act as electrode pads for electrically connecting the wiring substrate 100 to a mounting substrate such as a motherboard (not illustrated). The pitch between the exposed parts of the bottom surface of the wiring layer 110 is narrower than the pitch between the exposed parts of the fourth insulation layer 170.

The first, second, and third insulation layers 120, 140, 160 are formed of, for example, an insulation resin having a non-photosensitive property. The first, second, and third insulation layers 120, 140, 160 contain, for example, fillers including less than 30 vol % silica ($SiO_2$). The thermal expansion coefficient of the first, second, and third insulation layers 120, 140, 160 is, for example, approximately 50 ppm/° C.

The fourth insulation layer 180 is formed of, for example, an insulation resin having a photosensitive property. The fourth insulation layer 180 also contains fillers. However, because exposing cannot be performed in a case where a large amount of filler is contained in an insulation resin having a photosensitive property, there is a limit (upper limit) in the amount of filler that can be contained in the fourth insulation resin 180. Therefore, the thermal expansion coefficient of the fourth insulation layer 180 is greater than the thermal expansion coefficient of the first insulation layer 120, the second insulation layer 140, and the third insulation layer 160. For example the thermal expansion coefficient of the fourth insulation layer 180 is, for example, approximately 65 ppm/° C.

Thus, only the uppermost insulation layer (e.g., fourth insulation layer 180 of FIG. 1) of a related art wiring substrate is formed of an insulation resin having a photosensitive property. Typically, insulation layers of the related art wiring substrate other than the uppermost insulation layer (e.g., first insulation layer 120, second insulation layer 140, third insulation layer 160 of FIG. 1) are formed of an insulation resin having a non-photosensitive property and containing a filler including less than 30 vol. % silica ($SiO_2$).

As illustrated in FIG. 1, the side of the wiring substrate 100 toward the first wiring layer 110 (i.e. the side of the wiring substrate 100 including electrode pads to be connected to a semiconductor chip or the like (not illustrated)) tends to warp (curve) into a concave shape in a case where the configuration of the wiring substrate 100 includes an uppermost insulation layer (i.e. fourth insulation layer 180) formed of an insulation resin having a photosensitive property and other insulation layers besides the uppermost layer (i.e. first insulation layer 120, second insulation layer 140, third insulation layer 160) formed of an insulation resin having a non-photosensitive property and containing a filler including less than 30 vol. % silica ($SiO_2$). That is, the wiring substrate 100 tends to warp toward the side of the wiring substrate 100 at which the electrode pads are formed ("semiconductor chip mounting side" of the wiring substrate 100). Further, the wiring substrate 100 having such configuration may have a warp $T_1$ exceeding 600 μm.

The tendency of warping and the amount of warping are substantially the same as those of the configuration of the wiring substrate 100 illustrated in FIG. 1 even in a case of a configuration in which an uppermost insulation layer (i.e. fourth insulation layer 180) is formed of an insulation resin having a non-photosensitive property and all of the insulation layers (i.e. first insulation layer 120, second insulation layer 140, third insulation layer 160, fourth insulation layer 180) are formed of an insulation resin having a non-photosensitive property and containing a filler including less than 30 vol. % silica ($SiO_2$).

SUMMARY

According to an aspect of the invention, there is provided a wiring substrate including plural wiring layers and plural insulation layers being alternately stacked one on top of the other, wherein the plural insulation layers are formed with an insulation resin having the same composition, wherein the plural insulation layers are formed with a filler having the same composition, wherein the filler content of each of the plural insulation layers ranges from 30 vol % or more to 65 vol % or less, and wherein the thermal expansion coefficient of each of the plural insulation layers ranges from 12 ppm/° C. or more to 35 ppm/° C. or less.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

BRIEF DESCRIPTION OF DRAWINGS

FIG. 3 is a schematic diagram illustrating a process of a wiring substrate manufacturing method according to the first embodiment of the present invention (part 1);

FIG. 4 is a schematic diagram illustrating a process of a wiring substrate manufacturing method according to the first embodiment of the present invention (part 2);

FIG. 5 is a schematic diagram illustrating a process of a wiring substrate manufacturing method according to the first embodiment of the present invention (part 3);

FIG. 6 is a schematic diagram illustrating a process of a wiring substrate manufacturing method according to the first embodiment of the present invention (part 4);

FIG. 20 is a table illustrating the results of simulation of warping of a wiring substrate.

DESCRIPTION OF EMBODIMENTS

In the following, embodiments of the present invention are described with reference to the accompanying drawings.

[First Embodiment]

A configuration of a wiring substrate 10 according to a first embodiment of the present invention is described.

[Configuration of Wiring Substrate According to First Embodiment]

Figure 1:
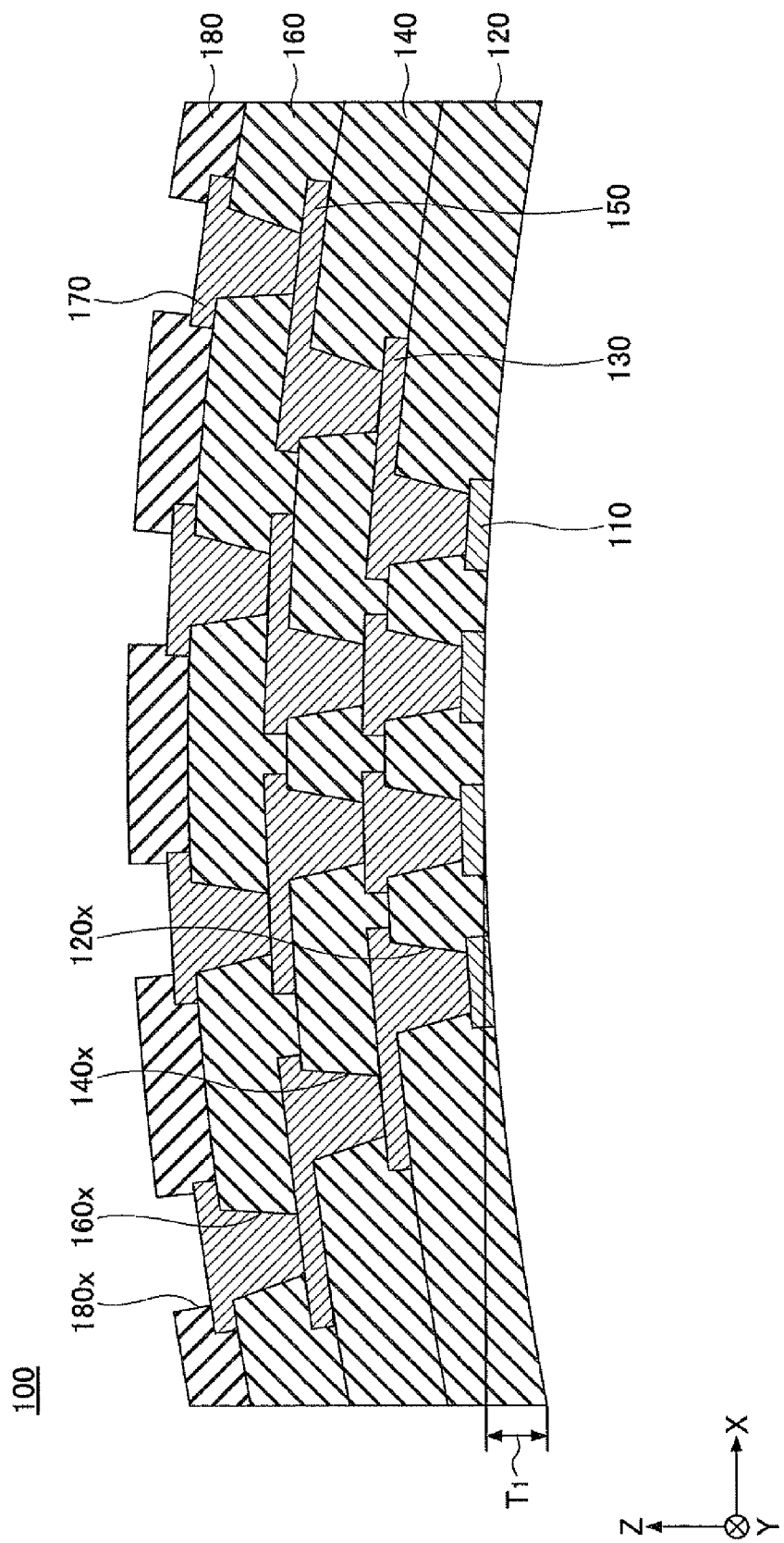
FIG. 1 is a cross-sectional view of a wiring substrate according to a related art example.
Figure 2:
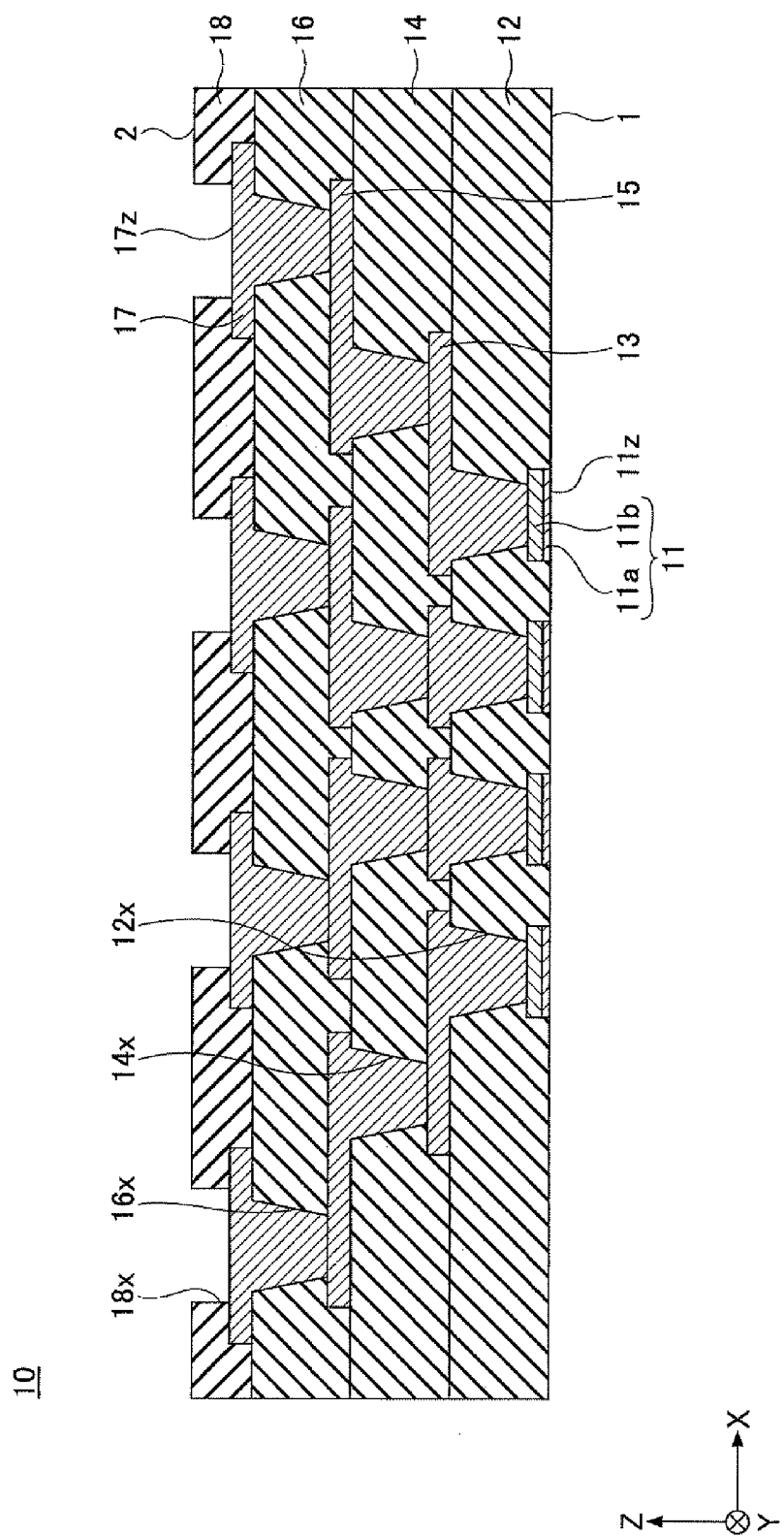
FIG. 2 is a cross-sectional view illustrating a wiring substrate according to a first embodiment of the present invention.

FIG. 2 is a cross-sectional view illustrating the wiring substrate 10 according to the first embodiment. In FIG. 2, the wiring substrate 10 includes a first wiring layer 11, a first insulation layer 12, a second wiring layer (also referred to as "first intermediate wiring layer") 13, a second insulation layer 14, a third wiring layer (also referred to as "second intermediate wiring layer") 15, a third insulation layer 16, a fourth wiring layer 17, and a fourth insulation layer 18 that are stacked in this order.

It is to be noted that one of a lower surface of the first insulation layer 12 (a surface of the first insulation layer 12 opposite to a surface of the first insulation layer 12 contacting the second insulation layer 14) and an upper surface of the fourth insulation layer 18 (a surface of the fourth insulation layer 18 opposite to a surface of the fourth insulation layer 18 contacting the third insulation layer 16) may be referred to as a first main surface of the wiring substrate 10 and the other of the lower surface of the first insulation layer 12 and the upper surface of the fourth insulation layer 18 may be referred to as a second main surface of the wiring substrate 10. In the example illustrated in FIG. 2 where the first main surface (indicated with reference numeral 1 in FIG. 2) of the wiring substrate 10 is the lower surface of the first insulation layer 12, the insulation layer nearest to the first main surface 1 is the first insulation layer 12. Further, in the example illustrated in FIG. 2 where the second main surface (indicated with reference numeral 2 in FIG. 2) of the wiring substrate 10 is the upper surface of the fourth insulation layer 18, the insulation layer nearest to the second main surface 2 is the fourth insulation layer 18. The description of the first and second main surfaces 1, 2 of the wiring substrate 10 can also be applied to other below-described embodiments of the wiring substrate.

The first wiring layer 11 is formed at a lowest layer of the wiring substrate 10. The first wiring layer 11 includes a first layer 11a and a second layer 11b. The first layer 11a may be a conductive layer including, for example, a gold (Au) film, a palladium (Pd) film, and a nickel (Ni) film stacked in this order. The gold film of the first layer 11a is exposed at an outer part of the wiring substrate 10. Alternatively, the first layer 11a may be a conductive layer including, for example, a gold (Au) film and a nickel (Ni) film stacked in this order where the gold film is exposed at an outer part of the wiring substrate 10. The second layer 11b may be a conductive layer including, for example, a copper (Cu) film. The thickness of the first wiring layer 11 is, for example, approximately 10 μm-20 μm.

A part of the first wiring layer 11 (first layer 11a), which is exposed at a part of the first insulation layer 12, acts as an electrode pad to be connected to a semiconductor chip or the like (not illustrated). The part of the first wiring layer 11 exposed at a part of the first insulation layer 12 may also be referred to as "first electrode pad 11z". The side of the wiring substrate 10 at which the first electrode pad 11z is formed may be referred to as "semiconductor chip mounting side". The first electrode pad 11z is flat and is formed in a shape of, for example, a circle. The first electrode pad 11z has a diameter of, for example, approximately 40 μm-120 μm. The pitch between the first electrode pads 11z is, for example, approximately 100 μm-200 μm.

The first insulation layer 12 is formed in a manner covering a side surface of the first wiring layer 11 and an upper surface of the first wiring layer (a surface of the first wiring layer 11 opposite to a surface of the first wiring layer 11 contacting the below-described via wirings of the second wiring layer 13) and having a lower surface that is exposed. The material of the first insulation layer 12 may be, for example, an insulation resin that mainly includes an epoxy resin and has a non-photosensitive property. The material of the insulation resin is, for example, a thermosetting resin. The thickness of the first insulation layer 12 is, for example, approximately 15 μm-35 μm.

The first insulation layer 12 contains a filler of silica ($SiO_2$). However, the filler contained in the first insulation layer 12 is not limited to silica ($SiO_2$). For example, the filler contained in the first insulation layer 12 may be kaolin ($Al_2Si_2O_5$ ($OH_4$)), talc ($Mg_3Si_4O_{10}$ ($OH_2$)), or alumina ($Al_2O_3$). It is to be noted that the filler contained in the first insulation layer 12 may also be used in other insulation layers of the embodiments described below. For example, the amount of filler contained in the first insulation layer 12 ranges from approximately 30 vol % or more to 65 vol % or less. The minimum particle diameter of the filler contained in the first insulation layer 12 is preferably, for example, 0.1 μm. The maximum particle diameter of the filler contained in the first insulation layer 12 is preferably, for example, 5 μm. The average particle diameter of the filler contained in the first insulation layer 12 is preferably 0.5 μm-2 μm.

By adjusting the amount of filler contained in the first insulation layer 12 to the range of approximately 30 vol % or more to 65 vol % less, the thermal expansion coefficient of the first insulation layer 12 can be adjusted to range from 12 ppm/° C. or more to 35 ppm/° C. or less. That is, by increasing the amount of filler contained in the first insulation layer 12, the thermal expansion coefficient of the first insulation layer 12 decreases. In a case where the amount of filler contained in the first insulation layer 12 is more than 65 vol %, it becomes difficult to form an insulation layer with resin. Therefore, the upper limit of the amount of filler contained in the first insulation layer 12 is preferred to be 65 vol %. The warping of the wiring substrate 10 can be reduced by adjusting the amount of filler contained in the first insulation layer 12 so that the thermal expansion coefficient of the first insulation layer 12 becomes close to the thermal expansion coefficient of, for example, copper (Cu) of the second wiring layer 13. The thermal expansion coefficient of copper is approximately 17 ppm/° C. It is to be noted that the thermal expansion coefficient described in this description of embodiments ranges from 25° C. to 150° C. unless described as otherwise.

The second wiring layer 13 is formed on the first insulation layer 12. The second wiring layer 13 includes a via wire formed inside each of first via holes 12x penetrating through the first insulation layer 12 and exposing an upper surface of the first wiring layer 11. The second wiring layer 13 also includes a wiring pattern formed on the first insulation layer 12. The first via hole 12x is open toward the second insulation layer 14 and has a bottom surface formed by the upper surface of the first wiring layer 11. In this embodiment, the first via hole 12x is a concave part having a circular truncated shape in which an open portion of the concave part (first via hole 12x) has an area greater than the area of a bottom plane of the concave part (first via hole 12x). Further, the first via hole 12x (concave part) has the via wire of the second wiring layer 13 formed therein.

The second wiring layer 13 is electrically connected to the first wiring layer 11 exposed at the bottom surfaces of the first via holes 12x. The material of the second wiring layer 13 may be, for example, copper (Cu). A wiring pattern that forms the second wiring layer 13 may have a thickness of, for example, approximately 10 μm-20 μm.

The second insulation layer 14 is formed on the first insulation layer 12 in a manner covering the second wiring layer 13. The material of the second insulation layer 14 is preferably an insulation resin having a non-photosensitive property and having substantially the same composition as that of the first insulation layer 12. Further, in order to reduce the warping of the wiring substrate 10, it is preferable for the second insulation layer 14 to contain a filler having substantially the same composition as the filler contained in the first insulation layer 12 and preferable for the amount of filler contained in the second insulation layer 14 to be substantially the same as the amount of filler contained in the first insulation layer 12. The second insulation layer 14 may have a thickness of, for example, approximately 15 μm-35 μm.

The third wiring layer 15 is formed on the second insulation layer 14. The third wiring layer 15 includes a via wire formed inside each of second via holes 14x penetrating through the second insulation layer 14 and exposing an upper surface of the second wiring layer 13. The third wiring layer 15 also includes a wiring pattern formed on the second insulation layer 14. The second via hole 14x is open toward the third insulation layer 16 and has a bottom surface formed by the upper surface of the second wiring layer 13. In this embodiment, the second via hole 14x is a concave part having a circular truncated shape in which the open part of the second via hole 14x has an area greater than the area of the bottom surface of the second via hole 14x. Further, the second via hole 14x (concave part) has the via wire of the third wiring layer 15 formed therein.

The third wiring layer 15 is electrically connected to the second wiring layer 13 exposed at the bottom surfaces of the second via holes 14x. The material of the third wiring layer 15 may be, for example, copper (Cu). A wiring pattern that forms the second wiring layer 15 may have a thickness of, for example, approximately 10 μm-20 μm.

The third insulation layer 16 is formed on the second insulation layer 14 in a manner covering the third wiring layer 15. The material of the third insulation layer 16 is preferably an insulation resin having a non-photosensitive property and having substantially the same composition as those of the first and second insulation layers 12, 14. Further, in order to reduce the warping of the wiring substrate 10, it is preferable for the third insulation layer 16 to contain a filler having substantially the same composition as the filler contained in the first and second insulation layers 12, 14 and preferable for the amount of filler contained in the third insulation layer 16 to be substantially the same as the amount of filler contained in the first and second insulation layers 12, 14. The third insulation layer 16 may have a thickness of, for example, approximately 15 μm-35 μm.

The fourth wiring layer 17 is formed on the third insulation layer 16. The fourth wiring layer 17 includes a via wire formed inside a third via hole 16x penetrating through the third insulation layer 16 and exposing an upper surface of the third wiring layer 15. The fourth wiring layer 17 also includes a wiring pattern formed on the third insulation layer 16. The third via hole 16x is open towards the fourth insulation layer 18 and has a bottom surface formed by the upper surface of the third wiring layer 15. In this embodiment, the third via hole 16x is a concave part having a circular truncated shape in which the open part of the third via hole 16x has an area smaller than the area of the bottom surface of the third via hole 16x. Further, the third via hole 16x (concave part) has the via wire of the fourth wiring layer 17 formed therein.

The fourth wiring layer 17 is electrically connected to the third wiring layer 15 exposed at the bottom surfaces of the third via holes 16x. The material of the fourth wiring layer 17 may be, for example, copper (Cu). A wiring pattern that forms the fourth wiring layer 17 may have a thickness of, for example, approximately 10 μm-20 μm.

The fourth insulation layer 18 is formed on the third insulation layer 16 in a manner covering the fourth wiring layer 17. The material of the fourth insulation layer 18 is preferably an insulation resin having a non-photosensitive property and having substantially the same composition as those of the first, second, and third insulation layers 12, 14, 16. Further, in order to reduce the warping of the wiring substrate 10, it is preferable for the fourth insulation layer 18 to contain a filler having substantially the same composition as the filler contained in the first, second, and third insulation layers 12, 14, 16, and preferable for the amount of filler contained in the fourth insulation layer 18 to be substantially the same as the amount of filler contained in the first, second and third insulation layers 12, 14, 16. The fourth insulation layer 18 may have a thickness of, for example, approximately 15 μm-35 μm.

The fourth insulation layer 18 includes opening parts 18x. Portions of the fourth wiring layer 17 are exposed at the bottoms of the opening parts 18x. The portions of the fourth wiring layer 17, which are exposed at the bottoms of the opening parts 18x, act as electrode pads to be electrically connected to a mounting board (not illustrated) such as a motherboard. According to necessity, a metal layer, for example, may be formed on the portions of the fourth wiring layer 17 exposed at the bottom of the opening parts 18x. The metal layer may be, for example, an Au layer, a Ni/Au layer (i.e., a metal layer including a Ni layer and a Au layer stacked one on top of the other in this order), or a Ni/Pd/Au layer (i.e., a metal layer including a Ni layer, a Pd layer, and a Au layer stacked one on top of the other in this order).

Further, external connection terminals (e.g., solder balls, lead pins) may be formed on parts of the fourth wiring layer 17 exposed at the bottom of the opening parts 18x. In the case of forming the metal layer on the portions of the fourth wiring layer 17 exposed at the bottom of the opening parts 18x, the external connection terminals may be formed on the metal layer. The external connection terminals act as terminals for electrically connecting with a mounting board (not illustrated) such as a motherboard. Alternatively, the parts of the fourth wiring layer 17 exposed at the bottom of the opening parts 18x may be used as the external connection terminals. Alternatively, in the case of forming the metal layer on the parts of the fourth wiring layer 17 exposed at the bottom of the opening parts 18x, the metal layer may be used as the external connection terminals.

In the description below, the part of the fourth wiring layer 17, which is exposed at a part of the fourth insulation layer 18 (i.e. at the bottom of the opening part 18x), acts as an electrode pad to be connected to a mounting board (not illustrated) such as a motherboard. The part of the fourth wiring layer 17 exposed at a part of the fourth insulation layer 18 (i.e. at the bottom of the opening part 18x) may also be referred to as "second electrode pad 17z". Further, the side of the wiring substrate 10 at which the second electrode pad 17z is formed may be referred to as "external connection terminal side" of the wiring substrate 10. The second electrode pad 17z is flat and is formed in a shape of, for example, a circle. The second electrode pad 17z has a diameter of, for example, approximately 200 μm-1000 μm. The pitch between the second electrode pads 17z is wider than the pitch between the first electrode pads 11z (e.g., approximately 100 μm-200 μm). The pitch between the second electrode pads 17z may be, for example, approximately 500 μm-1200 μm.

In the wiring substrate 10, the wiring pattern of the fourth wiring layer 17 may be formed on the third insulation layer 16 in a manner extending from the bottom parts of the third via holes 16x of the third insulation layer 16 to a desired part on the upper surface of the third insulation layer 16. Thereby, by exposing the wiring pattern of the fourth wiring layer 17 extending from the bottom parts of the third via holes 16x to the desired parts on the upper surface of the third insulation layer 16, the extended parts of the wiring pattern of the fourth wiring layer 17 can act as the second electrode pads 17z. In other words, a part of the wiring pattern of the fourth wiring layer 17 exposed at an area other than the third via holes 16x can also be used as the second electrode pad 17z.

Hence, the wiring substrate 10 according to an embodiment of the present invention can be obtained by forming all of the insulation layers (including the uppermost insulation layer) 12, 14, 16, 18 of the wiring substrate 10 with substantially the same insulation resin having the substantially the same composition and non-photosensitive property, by forming all of the insulation layers 12, 14, 16, 18 with fillers of substantially the same composition and amount ranging from approximately 30 vol % or more to 65 vol % or less, and by forming all of the insulation layers 12, 14, 16, 18 that exhibit a thermal expansion coefficient ranging from approximately 12 ppm/° C. or more to 35 ppm/° C. or less. Thereby, the thermal expansion coefficient of all of the insulation layers 12, 14, 16, 18 can be closer to the thermal expansion coefficient of copper (Cu) that forms the wiring layers 11, 13, 15, 17 of the wiring substrate 10. Accordingly, warping of the wiring substrate 10 can be prevented.

As described above, the warping of the wiring substrate 10 can be reduced significantly compared to the warping of the wiring substrate 100 of the related art example. With the wiring substrate 100 of the related art example, the semiconductor chip mounting side of the wiring substrate 100 tends to warp in a concave manner. The semiconductor chip mounting side of the wiring substrate 10 tends to warp in a relatively convex manner compared to the warping of the wiring substrate 100 (see, for example, below-described FIG. 20)

[Method for Manufacturing Wiring Substrate According to a First Embodiment of the Present Invention]

First, as illustrated in FIG. 3, a substrate 21 is prepared. For example, a silicon sheet, a glass sheet, or a metal foil may be used as the substrate 21. However, in this embodiment, a copper foil is used as the substrate 21. The copper foil is used as the substrate 21 because the copper foil can be used as a power feed layer when performing an electroplating process in the below-described step illustrated in FIG. 5 and the copper foil can be removed when performing an etching process after the below-described step illustrated in FIG. 10. The substrate 21 may be formed having a thickness ranging from, for example, approximately 35 μm to 100 μm.

Then, in the step illustrated in FIG. 4, a resist layer 22 including opening parts 22x corresponding to the first wiring layer 11 is formed on a first surface of the substrate 21. More specifically, a liquid-like or a paste-like resist material including a photo-sensitive resin composition (e.g., epoxy resins, imide resins) is applied to the first surface of the substrate 21. Alternatively, a film-like resin material including a photo-sensitive resin composition (e.g., epoxy resins, imide resins) may be laminated to the first surface of the substrate 21. Then, the opening parts 22x are formed by performing an exposing process and a developing process on the substrate 21 applied with or laminated with the resin material. Thereby, the resist layer 22 including the opening parts 22x can be obtained. Alternatively, a film-like resin material formed with opening parts 22x beforehand may be laminated to the first surface of the substrate 21.

The positions in which the opening parts 22x are formed correspond to the below-described positions of the first wiring layer 11 formed in the step illustrated in FIG. 5. The pitch between the opening parts 22x may range from, for example, approximately 100 μm to 200 μm. The plan shape of the opening parts 22x may be, for example, a circle. The diameter of the circle may range from, for example, approximately 40 μm to 120 μm.

Then, the first wiring layer 11 including the first and second layers 11a, 11b is formed inside the opening parts 22x of the first surface of the substrate 21. In this embodiment, the first wiring layer 11 is formed by performing, for example, an electroplating method on the substrate 21 where the substrate 21 is used as a power feed layer.

The first layer 11a includes, for example, a gold (Au) film, a palladium (Pd) film, and a nickel (Ni) film stacked in this order. Thus, the first layer 11a is formed by performing, for example, the electroplating process (using the substrate 21 as the power feed layer) to form the gold (Au) film, the palladium (Pd) film, and the nickel (Ni) film in this order. Then, the second layer 1ib is formed by performing, for example, the electroplating process (using the substrate 21 as the power feed layer) to form a copper (Cu) film on the first layer 11a. Alternatively, the first layer 11a may include a gold (au) film and a nickel (Ni) film that are stacked in this order.

Then, after removing the resist layer 22 formed in the step illustrated in FIG. 5, the first insulation layer 12 is formed on the first surface of the substrate 21 in a manner covering the first wiring layer 11 as illustrated in FIG. 6. The material of the first insulation layer 12 may be, for example, an insulation resin that mainly includes an epoxy resin and has a non-photosensitive property. The material of the insulation resin is, for example, a thermosetting resin. The thickness of the first insulation layer 12 is, for example, approximately 15 μm-35 μm. The first insulation layer 12 contains a filler formed of silica ($SiO_2$).

In a case where a film-like insulation resin mainly including an epoxy resin and having a non-photosensitive property is used as the material of the first insulation layer 12, the film-like insulation resin (i.e. insulation layer 12) is laminated on the first surface of the substrate in a manner covering the first wiring layer 11. The lamination is performed in a vacuum atmosphere. Then, the laminated first insulation layer 12 is applied with pressing force while being cured at a temperature above a setting temperature of the first insulation layer 12.

Figure 7:
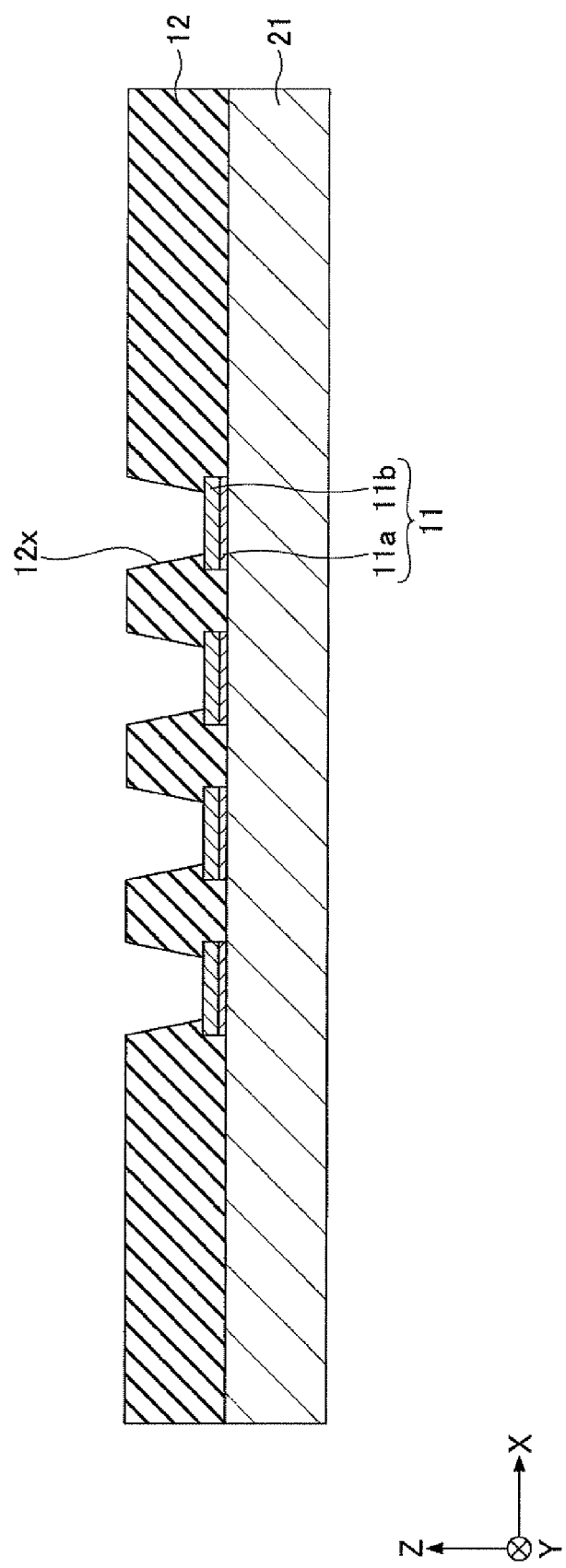
FIG. 7 is a schematic diagram illustrating a process of a wiring substrate manufacturing method according to the first embodiment of the present invention (part 5)

Then, the first via holes 12x are formed in the first insulation layer 12 in a manner penetrating the first insulation layer 12 and exposing the upper surface of the first wiring layer 11 as illustrated in FIG. 7. The first via hole 12x may be formed by using, for example, a laser processing method (e.g., $CO_2$ laser). The first via hole 12x, being formed by the laser processing method, is open toward the second insulation layer 14 and has a bottom surface formed by the upper surface of the first wiring layer 11. Further, the first via hole 12x is a concave part having a circular truncated shape in which an open portion of the concave part has an area greater than the area of a bottom plane of the concave part. The other via holes (e.g., second and third via holes 14x, 16x) are also formed in the same shape as the first via hole 12x by using the laser processing method. In the case where the first via hole 12x is formed with the laser processing method, a desmear process is performed for removing residual resin of the first insulation layer 12 adhered to the upper surface of the first wiring layer 11 exposed at bottom parts of the first via holes 12x.

Figure 8:
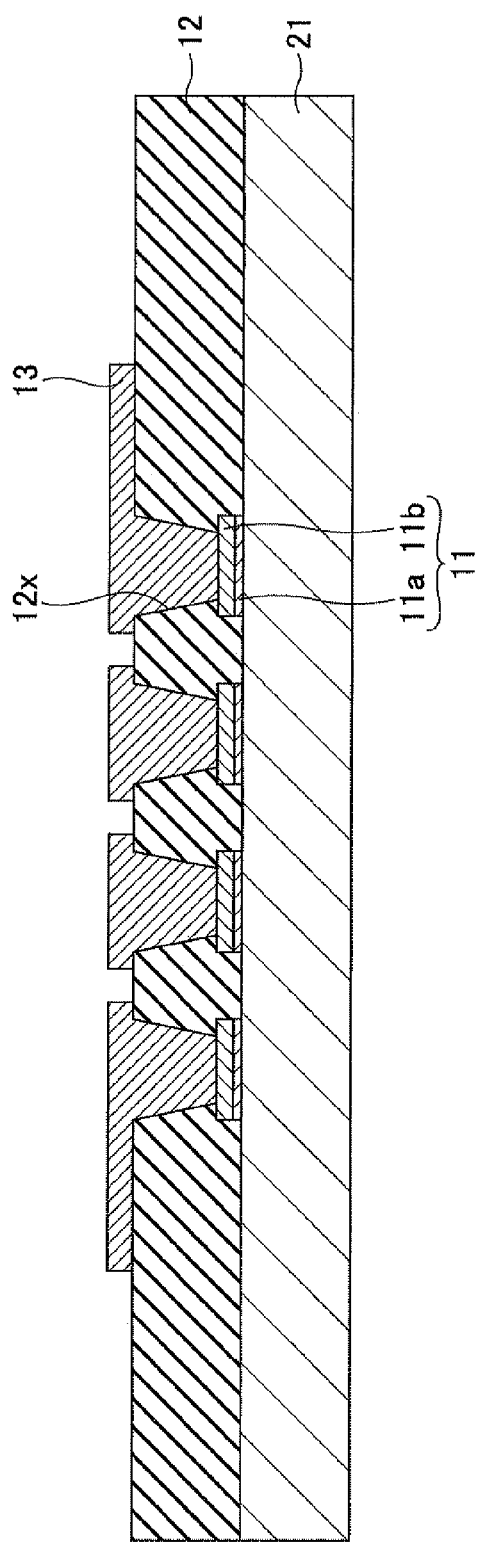
FIG. 8 is a schematic diagram illustrating a process of a wiring substrate manufacturing method according to the first embodiment of the present invention (part 6)

Then, the second wiring layer 13 is formed on the first insulation layer 12 as illustrated in FIG. 8. The second wiring layer 13 includes a via wire formed inside each of the first via holes 12x and a wiring pattern formed on the first insulation layer 12. The second wiring layer 13 is electrically connected to the first wiring layer 11 exposed at the bottom part of the first via holes 12x. The material of the second wiring layer 13 may be, for example, copper (Cu).

The second wiring layer 13 may be formed using various wiring forming methods such as a semi-additive process or a subtractive process. An example of forming the second wiring layer 13 using the semi-additive process is described.

First, a seed layer (not illustrated) is formed on the upper surface of the first wiring layer 11 exposed at the bottom parts of the first via holes 12x and on the first insulation layer 12 (including the sidewalls of the first via holes 12x). The seed layer (not illustrated) may be formed of, for example, copper (Cu). For example, an electroless plating method or a sputtering method may be used to form the seed layer (not illustrated). Further, a resist layer (not illustrated) including opening parts corresponding to the second wiring layer 13 is formed on the seed layer. Then, a wiring layer (not illustrated) is formed in the opening parts of the resist layer by performing an electroplating method using the seed layer as the power feed layer. The wiring layer may be formed of, for example, copper (Cu). Then, after removing the resist layer, portions of the seed layer that are not covered by the wiring layer are removed. The portions of the seed layer are removed by using the wiring layer as a mask and etching the portions that are not covered by the wiring layer. Thereby, the second wiring layer 13, which includes via wires formed inside the first via holes 12x and a wiring pattern formed on the first insulation layer 12, is formed.

Figure 9:
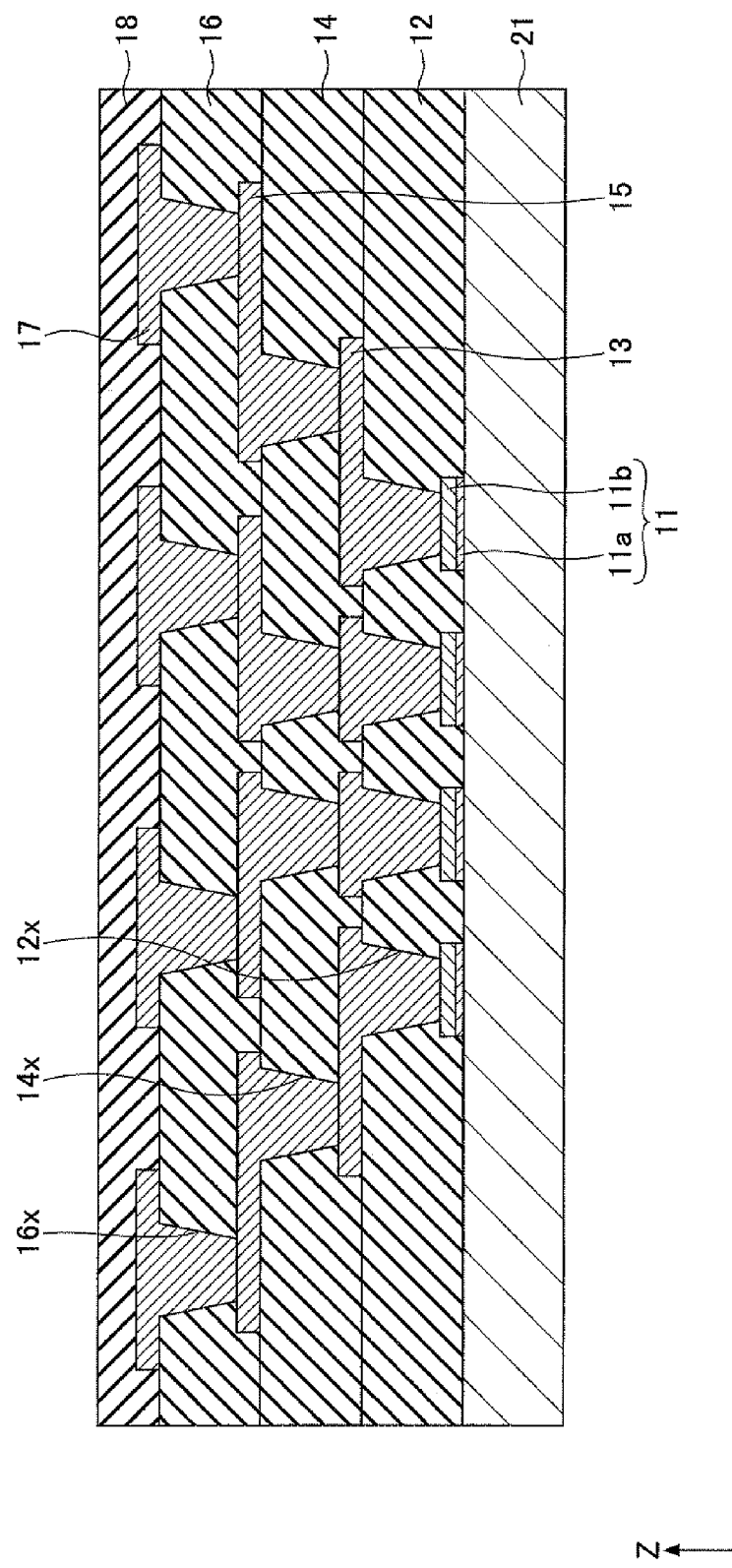
FIG. 9 is a schematic diagram illustrating a process of a wiring substrate manufacturing method according to the first embodiment of the present invention (part 7)

Then, by repeating the steps illustrated in FIGS. 6-8, the second insulation layer 14, the third wiring layer 15, the third insulation layer 16, the fourth wiring layer 17, and the fourth insulation layer 18 are stacked on the first insulation layer 12 as illustrated in FIG. 9. That is, after forming the second insulation layer 14 on the first insulation layer 12 in a manner covering the second wiring layer 13, the second via holes 14x are formed in a manner penetrating the second insulation layer 14 and exposing the upper surface of the second wiring layer 13. The material of the second insulation layer 14 is preferably the same as that of the first insulation layer 12. That is, it is preferable to form the second insulation layer 14 with, for example, an insulation resin that mainly includes an epoxy resin and has a non-photosensitive property. Further, it is preferable for the second insulation layer 14 to contain a filler that is the same as the filler contained in the first insulation layer 12. It is preferable for the composition and the amount of filler contained in the second insulation layer 14 to be substantially the same as those of the filler contained in the first insulation layer 12. Thereby, warping of the wiring substrate 10 can be reduced. The thickness of the second insulation layer 14 ranges from, for example, approximately 15 μm to 35 μm.

Then, the third wiring layer 15 is formed on the second insulation layer 14. The third wiring layer 15 is to be electrically connected to the second wiring layer 13 via the second via hole 14x. The third wiring layer 15 includes a via wire formed inside each of the second via holes 14x and a wiring pattern formed on the second insulation layer 14. The third wiring layer 15 is electrically connected to the second wiring layer 13 exposed at the bottom parts of the second via holes 14x. The material of the third wiring layer 15 may be, for example, copper (Cu). The third wiring layer 15 is formed by, for example, a semi-additive method. The thickness of the wiring pattern of the third wiring layer 15 ranges from, for example, approximately 10 μm to 20 μm.

Then, after forming the third insulation layer 16 on the second insulation layer 14 in a manner covering the third wiring layer 15, the third via holes 16x are formed in a manner penetrating the third insulation layer 16 and exposing the upper surface of the third wiring layer 15. The material of the third insulation layer 16 is preferably the same as that of the first and second insulation layers 12, 14. That is, it is preferable to form the third insulation layer 16 with, for example, an insulation resin that mainly includes an epoxy resin and has a non-photosensitive property. Further, it is preferable for the third insulation layers 16 to contain a filler that is the same as the filler contained in the first and the second insulation layers 12, 14. It is preferable for the composition and the amount of filler contained in the third insulation layer 16 to be substantially the same as those of the filler contained in the first and the second insulation layers 12, 14. Thereby, warping of the wiring substrate 10 can be reduced. The thickness of the third insulation layer 16 ranges from, for example, approximately 15 μm to 35 μm.

Then, the fourth wiring layer 17 is formed on the third insulation layer 16. The fourth wiring layer 17 is to be electrically connected to the third wiring layer 15 via the third via holes 16x. The fourth wiring layer 17 includes a via wire formed inside each of the third via holes 16x and a wiring pattern formed on the third insulation layer 16. The fourth wiring layer 17 is electrically connected to the third wiring layer 15 exposed at the bottom part of the third via holes 16x. The material of the fourth wiring layer 17 may be, for example, copper (Cu). The fourth wiring layer is formed by, for example, a semi-additive method. The thickness of the wiring pattern of the fourth wiring layer 17 ranges from, for example, approximately 10 μm to 20 μm.

Then, the fourth insulation layer 18 is formed on the third insulation layer 16 in a manner covering the fourth wiring layer 17. The material of the fourth insulation layer 18 is preferably the same as that of the first, second, and third insulation layers 12, 14, 16. That is, it is preferable to form the fourth insulation layer 18 with, for example, aninsulation resin that mainly includes an epoxy resin and has a non-photosensitive property. Further, it is preferable for the fourth insulation layer 18 to contain a filler that is the same as the filler contained in the first, second, and third insulation layers 12, 14, 16. It is preferable for the composition and the amount of filler contained in the fourth insulation layer 18 to be substantially the same as those of the filler contained in the first, second, and third insulation layers 12, 14, 16. Thereby, warping of the wiring substrate 10 can be reduced. The thickness of the fourth insulation layer 18 ranges from, for example, approximately 15 μm to 35 μm.

Accordingly, a predetermined built-up wiring layer configuration can be formed on the first surface of the substrate 21. In this embodiment, although the above-described built-up layer configuration is formed having 3 layers (i.e. the second, third, and fourth wiring layers 13, 15, 17), a built-up wiring layer configuration having n layers (n being an integer equal to or more than 1) may be formed.

Figure 10:
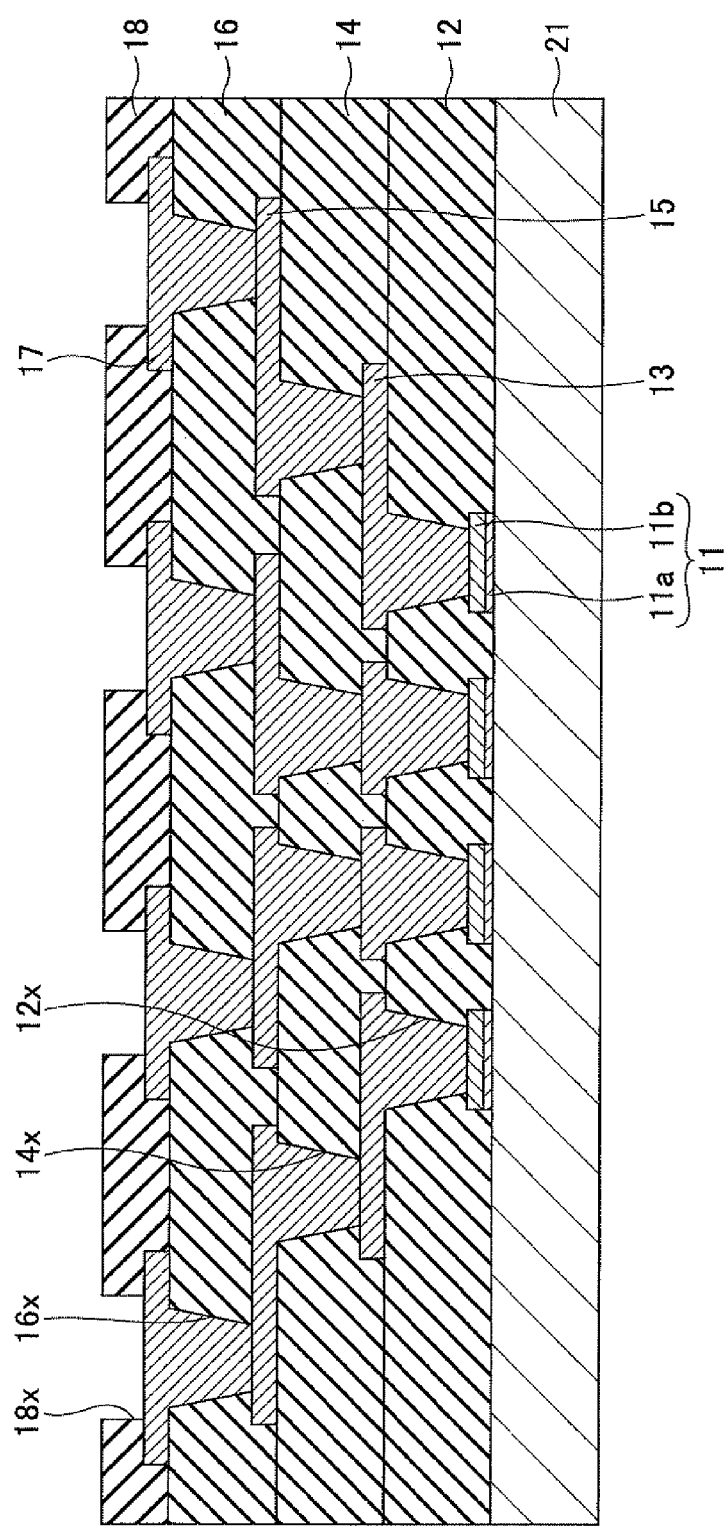
FIG. 10 is a schematic diagram illustrating a process of a wiring substrate manufacturing method according to the first embodiment of the present invention (part 8)

Then, the opening parts 18x are formed in the fourth insulation layer 18 in the step illustrated in FIG. 10. The opening parts 18x may be formed by using, for example, a laser processing method. Alternatively, the opening parts 18x may be formed by using the below-described blasting method.

According to necessity, a metal layer or the like may be formed on the fourth wiring layer 17 exposed at the bottom parts of the opening parts 18x by performing, for example, an electroless plating method. The metal layer may include, for example, an Au layer, an Ni/Au layer (i.e. the Ni layer and the Au layer stacked in this order) or a Ni/Pd/Au layer (i.e. the Ni layer, the Pd layer, and the Au layer stacked in this order).

Then, external connection terminals such as solder balls or lead pins may be formed on the fourth wiring layer 17 exposed at the bottom parts of the opening parts 18x. In a case where the metal layer or the like is formed on the fourth wiring layer 17 exposed at the bottom parts of the opening parts 18x, external connection terminals such as solder balls or lead pins may be formed on the metal layer or the like. The external connection terminals are terminals to be electrically connected to a mounting substrate such as a motherboard (not illustrated). The fourth wiring layer 17 exposed at the bottom parts of the opening parts 18x may also be used as the external connection terminals.

Then, by removing the substrate 21 illustrated in FIG. 10, the manufacturing of the wiring substrate 10 illustrated in FIG. 2 is completed. The substrate 21, which is formed of copper foil, may be removed by a wet-etching method using a solution such as an iron (II) chloride solution, a copper (II) chloride, or an ammonium persulfate solution. In this case of removing the substrate 21, only the substrate 21 formed of copper foil can be selectively etched because the outermost layer of the first wiring layer 11 exposed at the first insulation layer 12 is, for example, a gold (Au) film. However, in a case where the fourth wiring layer 17 is formed of copper (Cu), the fourth wiring layer 17 exposed at the bottom part of the opening parts 18x is to be covered with a mask for preventing the fourth wiring layer from being etched together with the substrate 21.

After the removal of the substrate 21, external connection terminals such as solder balls or lead pins may be formed on the fourth wiring layer 17 exposed at the bottom parts of the opening parts 18x. In a case where the metal layer or the like is formed on the fourth wiring layer 17 exposed at the bottom parts of the opening parts 18x, external connection terminals such as solder balls or lead pins may be formed on the metal layer or the like after the removal of the substrate 21. The external connection terminals are terminals to be electrically connected to a mounting substrate such as a motherboard (not illustrated). The fourth wiring layer 17 exposed at the bottom parts of the opening parts 18x may also be used as the external connection terminals. Alternatively, the external connection terminals such as solder balls or lead pins may be formed on the fourth wiring layer 17 exposed at the bottom parts of the opening parts 18x before the removal of the substrate 21.

Although FIGS. 3-10 illustrate an example of forming a single wiring substrate 10 on the substrate 21, plural wiring substrates 10 may be formed on the substrate 21 so that the plural substrates 10 can be obtained by dicing the substrate 21 into separate independent wiring substrates 10.

Hence, the wiring substrate according to the above-described first embodiment is manufactured so that all of the insulation layers (including the uppermost insulation layer) have substantially the same insulation resins including substantially the same composition and non-photosensitive property, have fillers of substantially the same composition and amount ranging from approximately 30 vol % or more to 65 vol % or less, and exhibit a thermal expansion coefficient ranging from approximately 12 ppm/° C. or more to 35 ppm/° C. or less. Thereby, the thermal expansion coefficient of all of the insulation layers becomes close to the thermal expansion coefficient of, for example, copper (Cu) which is approximately 17 ppm. Thereby, warping of the wiring substrate can be reduced.

In the above-described first embodiment, the side of the wiring substrate 10 at which the first electrode pads 11z are formed is described as the semiconductor chip mounting side of the wiring substrate 10 and the side of the wiring substrate 10 at which the second electrode pads 17z are formed is described as the external connection terminal mounting side of the wiring substrate 10. However, in another example, the side of the wiring substrate 10 at which the first electrode pads 11z are formed may be the external connection terminal mounting side, and the side of the wiring substrate 10 at which the second electrode pads 17z are formed may be the semiconductor chip mounting side. In an alternative example, the pitch of the first electrode pads 11z may range from, for example, approximately 500 μm to 1200 μm, and the pitch of the second electrode pads 17z may be narrower than the pitch of the first electrode pads 11z. That is, the pitch of the second electrode pads 17z may range from, for example, approximately 100 μm to 200 μm. Even with this alternative example, the same effects can be attained as those attained with the above-described embodiment of the wiring substrate 10.

<Second Embodiment>

The first embodiment describes the wiring substrate being manufactured by forming all of the insulation layers (including the uppermost insulation layer) of the wiring substrate with substantially the same insulation resin having substantially the same composition and non-photosensitive property, forming all of the insulation layers with fillers of substantially the same composition and amount ranging from approximately 30 vol % or more to 65 vol % or less, and forming all of the insulation layers that exhibit a thermal expansion coefficient ranging from approximately 12 ppm/° C. or more to 35 ppm/° C. or less. In the below-described wiring substrate according to the second embodiment, a reinforcement member (e.g., glass cloth) is provided in an insulation layer (third insulation layer) positioned adjacent to and below the uppermost insulation layer (fourth insulation layer) toward the external connection terminal side of the wiring substrate. In the description of the second embodiment, like components are denoted with like reference numerals as those of the first embodiment and are not further described.

[Configuration of Wiring Substrate According to Second Embodiment]

Figure 11:
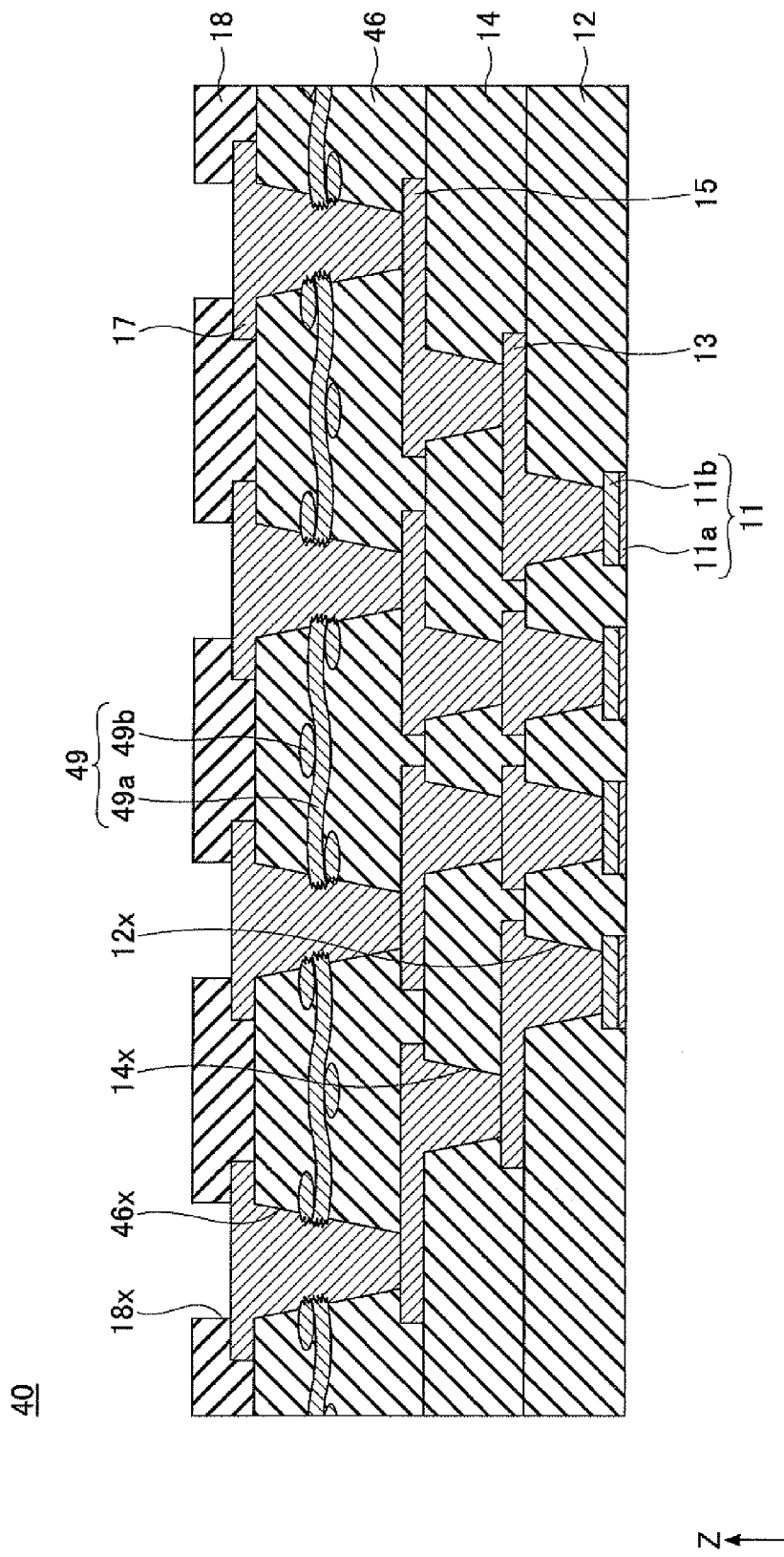
FIG. 11 is a cross-sectional view of a wiring substrate according to a second embodiment of the present invention.

FIG. 11 is a cross-sectional view of a wiring substrate 40 according to the second embodiment of the present invention. The difference between the wiring substrate 40 of the second embodiment (as illustrated in FIG. 11) and the wiring substrate 10 of the first embodiment (as illustrated in FIG. 2) is that the third insulation layer 16 is replaced with the third insulation layer 46.

The third insulation layer 46 is formed on the second insulation layer 14 in a manner covering the third wiring layer 15. The third insulation layer 46 includes, for example, an insulation resin impregnated in a glass cloth 49. The insulation resin impregnating the glass cloth 49 mainly includes, for example, an epoxy resin and has a non-photosensitive property. It is preferable for the non-photosensitive insulation resin included in the third insulation layer 46 to have substantially the same composition as the non-photosensitive insulation resin included in the first, second, and fourth insulation layers 12, 14, and 18. Further, it is preferable for the third insulation layer 46 to contain a filler having substantially the same composition as the filler contained in the first, second, fourth insulation layers 12, 14, 18 and preferable for the amount of filler contained in the third insulation layer 46 to be substantially the same as the amount of filler contained in the first, second, fourth insulation layers 12, 14, 18. Thereby, warping of the wiring substrate 40 can be reduced. The thickness of the third insulation layer 46 ranges from, for example, approximately 25 μm to 75 μm.

For example, the third insulation layer 46 may be formed by stacking a resin film (pre-preg) having been impregnated by the non-photosensitive insulation resin on the second insulation layer 14 and thermosetting (e.g., applying pressure to the resin film and heating the resin film) the resin film.

The fourth wiring layer 17 includes a via wire formed inside each of third via holes 46x penetrating through the third insulation layer 46 and exposing an upper surface of the third wiring layer 15. The fourth wiring layer 17 also includes a wiring pattern formed on the third insulation layer 46. The third via hole 46x is open toward the fourth insulation layer 18 and has a bottom surface formed by the upper surface of the third wiring layer 15. In this embodiment, the third via hole 46x is a concave part having a circular truncated shape in which the open part of the third via hole 46x has an area greater than the area of the bottom surface of the third via hole 46x. Further, the third via hole 46x (concave part) has the via wire of the fourth wiring layer 17 formed therein.

The third insulation layer 46 including the glass cloth 49 has a thickness greater than those of the other insulation layers 12, 14, 18 including no glass cloth. Accordingly, the third via hole 46x of the third insulation layer 46 is deeper than the first via hole 12x of the first insulation layer 12 and the second via hole 14x. Further, the diameter of the open part of the third via hole 46x (open part toward the fourth insulation layer 18) is larger than those of the first via hole 12x and the second via hole 14x. That is, the third via hole 46x has a larger volume than those of the first via hole 12x and the second via hole 14x. The third via holes 46x, which are positioned toward the external connection terminal side of the wiring substrate 40, are less strictly bound by design rules compared to the semiconductor chip mounting side of the wiring substrate 40. For example, the pitch between the second electrode pads 17z provided on the external connection terminal side can be formed wider than that of the first electrode pads 11z. Accordingly, no problems are caused even where the volume of the third via hole 46x is increased.

Figure 12:
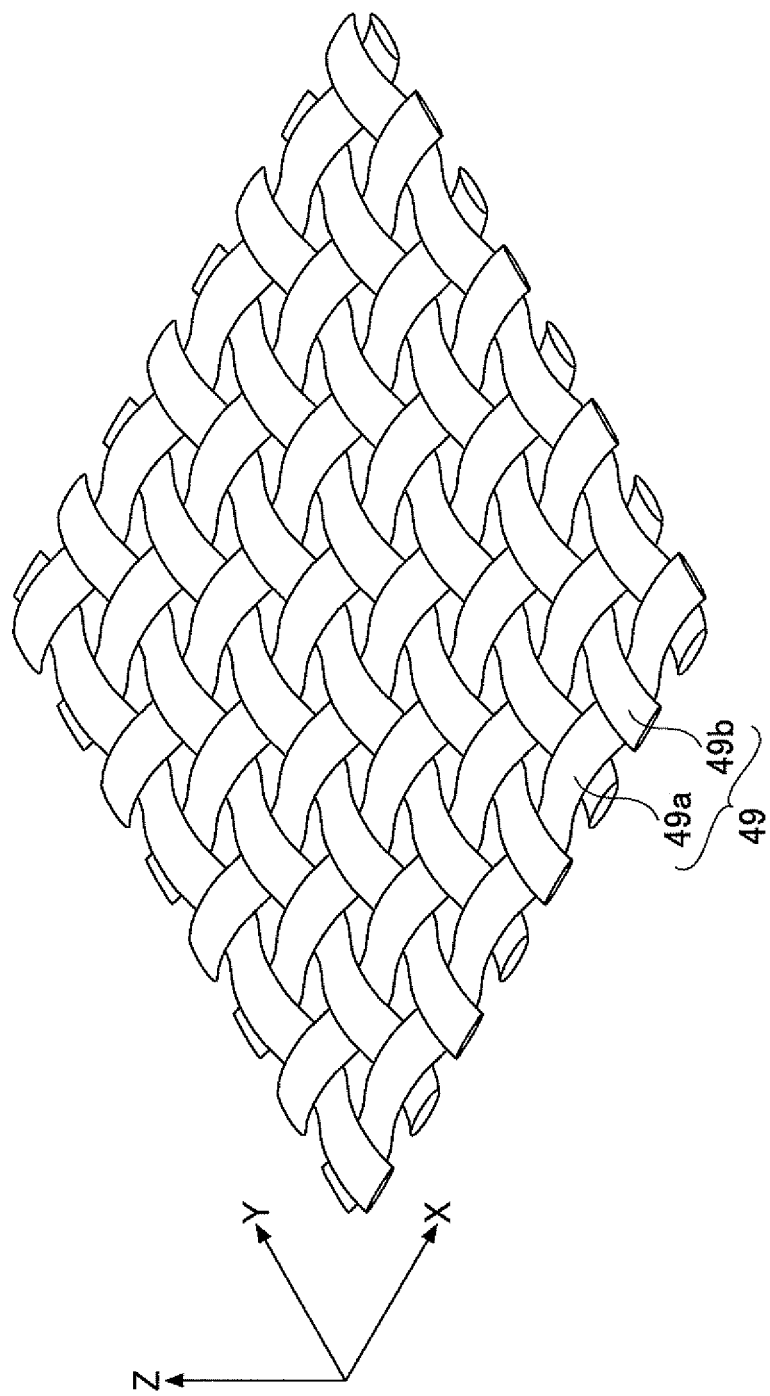
FIG. 12 is a cross-sectional view illustrating an example of a glass cloth according to an embodiment of the present invention.

As illustrated in FIG. 12, the glass cloth 49 is formed by plain weaving glass fiber bundles 49a arranged in the X-direction and glass fiber bundles 49b arranged in the Y-direction to form a lattice-like configuration. The glass cloth 49 is a representative example of a reinforcement member according to an embodiment of the present invention. For example, the glass fiber bundles 49a, 49b may have glass fibers (e.g., each fiber having a width of approximately several μm) being gathered together into a bundle having a width of approximately several 100 μm. Each of the glass fiber bundles 49a, 49b may have a thickness ranging from, for example, approximately 10 μm to 15 μm.

It is to be noted that the fiber bundles used for forming the reinforcement member (e.g., glass cloth 49) are not limited to glass fiber bundles. For example, the fiber bundles used for forming the reinforcement member may be carbon fiber bundles, polyester fiber bundles, tetron fiber bundles, nylon fiber bundles, or aramide fiber bundles. Further, the method for weaving the fiber bundles is not limited to plain weaving. For example, the method for weaving the fiber bundles may be satin weaving or twill weaving. Further, non-woven cloth may be used instead of the aforementioned woven cloth.

The reason for providing the glass cloth 49 only in the third insulation layer 46 is described below.

In general, a wiring layer used as electrode pads (in this embodiment, fourth wiring layer 17) exhibits a low remaining copper rate compared to other wiring layers. Such difference of remaining copper rate tends to cause warping of a wiring substrate. Accordingly, in this embodiment, the same effects as increasing the remaining copper rate of the fourth wiring layer 17 can be attained by providing the glass cloth 49 in the third insulation layer 46 adjacent to the fourth wiring layer 17. Thereby, the warping of the wiring substrate 40 can be reduced. The term "remaining copper rate" indicates the proportion of the area of a metal layer that forms a wiring layer with respect to the area of a given insulation layer. Although copper is assumed as the metal layer in this embodiment, a metal material other than copper may be used as the metal layer that forms the wiring layer.

Because the semiconductor chip mounting side of a wiring substrate is bound by stricter design rules compared to an external connection terminal side of the wiring substrate, it is not preferable to provide a glass cloth in an insulation layer toward the semiconductor chip mounting side of the wiring substrate. This is because providing the glass cloth in the insulation layer toward the semiconductor chip mounting side increases the size of the via holes of such an insulation layer and causes difficulty in, for example, achieving high integration of wiring patterns and narrowing the pitch between electrode pads.

Because the method for manufacturing the wiring substrate 40 is substantially the same as the method for manufacturing the wiring substrate 10, description of the method for manufacturing the wiring substrate 40 is omitted. The third via hole 46x may be formed by using the laser processing method or the below-described blasting method.

Hence, the wiring substrate according to the above-described second embodiment is also manufactured so that all of the insulation layers (including the uppermost insulation layer) have substantially the same insulation resins including substantially the same composition and non-photosensitive property, have fillers of substantially the same composition and amount ranging from approximately 30 vol % or more to 65 vol % or less, and exhibit a thermal expansion coefficient ranging from approximately 12 ppm/° C. or more to 35 ppm/° C. or less. In addition, the wiring substrate according to the second embodiment includes a reinforcement member (e.g., glass cloth) provided in an insulation layer (e.g., third insulation layer) below and adjacent to the uppermost insulation layer (e.g., fourth insulation layer) toward the external connection terminal side of the wiring substrate. Accordingly, the rigidity of the third insulation layer can be increased. Thus, warping of the wiring substrate can be further reduced compared to the wiring substrate of the first embodiment. By providing the reinforcement member (e.g., glass cloth) in the insulation layer (third insulation layer) below and adjacent to the uppermost insulation layer (fourth insulation layer) toward the external connection terminal side (the side which warps in a concave manner) of the wiring substrate, significantly effective resistance against the force causing the warping of the wiring substrate can be achieved. Thus, the warping of the wiring substrate can be further reduced.

Even in a case where the temperature of the wiring substrate is increased to a temperature surpassing the glass-transition temperature of the insulation resin in its insulation layers, the rigidity of the reinforcement member (e.g., glass cloth) restrains the warping of the wiring substrate. Therefore, steady behavior can be maintained even where the wiring substrate is placed in a high temperature atmosphere.

<Third Embodiment>

The first embodiment describes the wiring substrate being manufactured by forming all of the insulation layers (including the uppermost insulation layer) of the wiring substrate with substantially the same insulation resin having the substantially the same composition and non-photosensitive property, forming all of the insulation layers with fillers of substantially the same composition and amount ranging from approximately 30 vol % or more to 65 vol % or less, and forming all of the insulation layers that exhibit a thermal expansion coefficient ranging from approximately 12 ppm/° C. or more to 35 ppm/° C. or less. In the below-described wiring substrate according to the third embodiment, a reinforcement member (e.g., glass cloth) is provided in the uppermost insulation layer (fourth insulation layer) toward the external connection terminal side of the wiring substrate. In the description of the third embodiment, like components are denoted with like reference numerals as those of the first and second embodiments and are not further described.

[Configuration of Wiring Substrate According to Third Embodiment]

Figure 13:
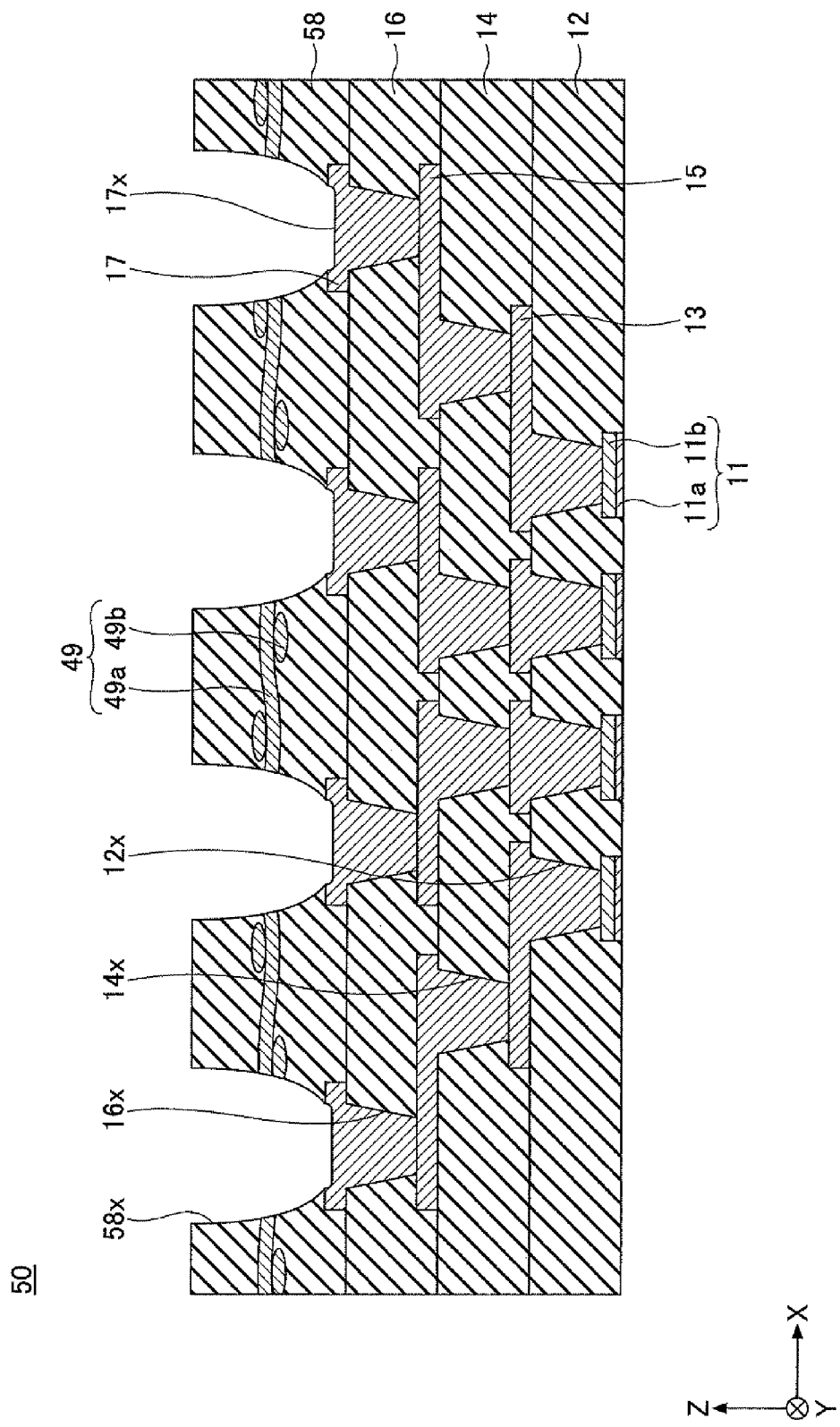
FIG. 13 is a cross-sectional view illustrating a wiring substrate according to a third embodiment of the present invention.

First, a configuration of the wiring substrate 50 according to the third embodiment of the present invention is described. FIG. 13 is a cross-sectional view illustrating a wiring substrate 50 according to the third embodiment of the present invention. The difference between the wiring substrate 50 of the third embodiment (as illustrated in FIG. 13) and the wiring substrate 10 of the first embodiment (as illustrated in FIG. 2) is that the fourth insulation layer 18 including the opening parts 18x is replaced with a fourth insulation layer 58 including opening parts 58x and concave parts 17x.

The fourth insulation layer 58, which is the uppermost insulation layer toward the external connection terminal side of the wiring substrate 50, includes, for example, an insulation resin impregnating a glass cloth 49. The insulation resin impregnating in the glass cloth 49 mainly includes, for example, an epoxy resin and has a non-photosensitive property. It is preferable for the non-photosensitive insulation resin included in the fourth insulation layer 58 to have substantially the same composition as the non-photosensitive insulation resin included in the first, second, and third insulation layers 12, 14, and 16. Further, it is preferable for the fourth insulation layer 58 to contain a filler having substantially the same composition as the filler contained in the first, second, third insulation layers 12, 14, 16 and preferable for the amount of filler contained in the fourth insulation layer 58 to be substantially the same as the amount of filler contained in the first, second, third insulation layers 12, 14, 16. Thereby, warping of the wiring substrate 50 can be reduced. The thickness of the fourth insulation layer 58 ranges from, for example, approximately 25 μm to 75 μm.

The fourth insulation layer 58 includes opening parts 58x. Further, concave parts 17x of the fourth wiring layer 17 are exposed at the bottom parts of the opening parts 58x. The concave parts 17x act as electrode pads to be electrically connected to a mounting substrate (not illustrated) such as a motherboard. According to necessity, a metal layer, for example, may be formed on the concave parts 17x. The metal layer may be, for example, an Au layer, a Ni/Au layer (i.e., a metal layer including a Ni layer and a Au layer stacked one on top of the other in this order), or a Ni/Pd/Au layer (i.e., a metal layer including a Ni layer, a Pd layer, and a Au layer stacked one on top of the other in this order).

Further, external connection terminals (e.g., solder balls, lead pins) may be formed on the concave parts 17x. In the case of forming the metal layer on the concave parts 17x, the external connection terminals may be formed on the metal layer. The external connection terminals act as terminals for electrically connecting with a mounting board (not illustrated) such as a motherboard. Alternatively, the concave parts 17x exposed at the bottom parts of the opening parts 58x may be used as the external connection terminals. Alternatively, in the case of forming the metal layer on the concave parts 17x, the metal layer may be used as the external connection terminals. In the description below, the concave parts 17x exposed at the bottom parts of the opening parts 58x may also be referred to as "second electrode pads 17x". Further, the side of the wiring substrate 50 at which the second electrode pads 17x are formed may be referred to as "external connection terminal side" of the wiring substrate 50.

Figure 14:
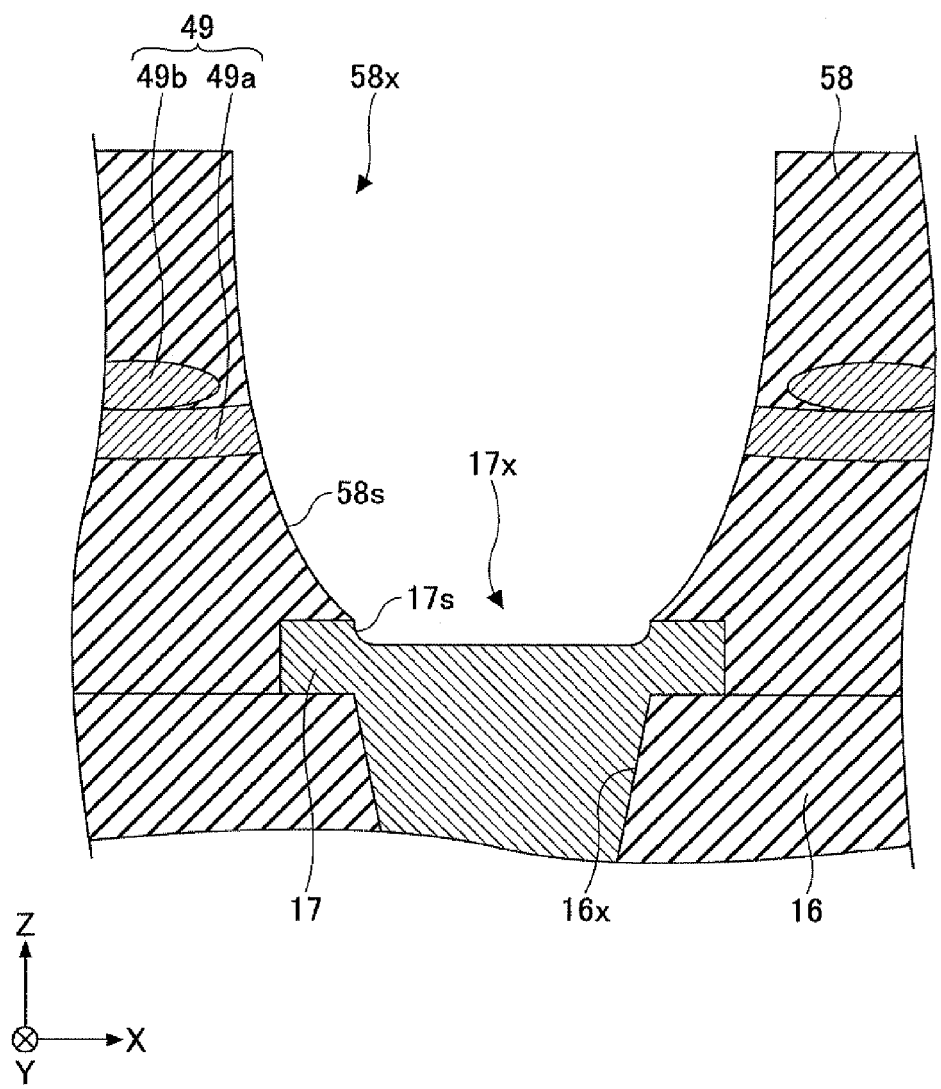
FIG. 14 is an enlarged cross-sectional view illustrating the vicinity of an opening part of FIG. 13.

FIG. 14 is an enlarged cross-sectional view illustrating the vicinity of the opening part 58x of FIG. 13. In FIG. 14, the opening part 58x becomes wider from the side toward the fourth wiring layer 17 to the opening of the opening part 58x. The cross-section of the sidewall 58s of the opening part 58x has a concave R (round) shape. That is, the opening part 58x has a curved sidewall 58s projecting or curving toward an outer periphery of the second electrode pad 17x. Further, the open end of the opening part 58x has an area larger than a cross-sectional area of the bottom of the opening part 58x. The opening part 58x may have, for example, a hemispherical shape. The plan shape of the opening part 58x may be, for example, a circle. The diameter of the circle (i.e. diameter of the open end of the opening part 58x) may range from, for example, approximately 220 μm to 1100 μm. It is to be noted that an end part of the glass cloth 49 does not protrude from the sidewall 58s of the opening part 58x because the opening part 58x is formed by using the below-described blasting method.

The concave part 17x becomes wider from the bottom surface toward the open end of the concave part 17x. The cross section of the sidewall 17s of the concave part 17x has a concave R (round) shape. The outer edge part of the concave part 17x remains within the bottom of the opening part 58x. That is, the outermost edge part of the sidewall 17s of the concave part 17x matches the innermost edge part of the sidewall 58s of the opening part 58x. The plan shape of the concave part 17x may be, for example, a circle. The diameter of the circle may range from, for example, approximately 200 μm to 1000 μm. The pitch between the concave parts 17x may range from, for example, approximately 500 μm to 1200 μm. The depth from the upper surface of the fourth wiring substrate 17 to the deepest part of the concave part 17x is, approximately, for example, approximately 0.5 μm to 4 μm.

It is to be noted that the plan shape of the concave part 17x (second electrode pad) and the opening part 58x (opening dedicated to second electrode pad) is not limited to a circle. For example, the plan shape of the concave part 17x and the opening part 58x may have a substantially rectangular shape. Thus, in the case where the plan shape of the concave part 17x and the opening part 58x have a rectangular shape, a pin (pin of a socket) to be inserted into the rectangular-shaped opening part 58x may have a longitudinal side matching a longitudinal side of the rectangular-shaped opening part 58x. Thereby, the process of inserting the pin into the opening part 58x can be facilitated.

In this embodiment, the cross-section of the sidewall 58s of the opening part 58x becomes a concave R (round) shape because the below-described blasting method is used. After the opening part 58x is formed, the use of the blasting method is continued for grinding the upper surface of the fourth wiring layer 17. Thereby, the concave part 17x is formed in continuation with the opening part 58x.

Although the opening part 58x may be formed by using the laser processing method, it is preferable to use the blasting method instead of the laser processing method for the following reasons.

First, because a substantially large opening part is to be formed in the uppermost insulation layer having a thickness greater than those of the other insulation layers, a laser is to be irradiated several times and processing time is increased in the case of using the laser processing method. Second, using the laser processing method to form the opening part may cause an end part of the glass cloth (cut by the laser processing method) to protrude from the sidewall of the opening part. Thus, in a case of forming a metal layer (e.g., Au layer) by using an electroless plating method or the like on the wiring layer exposed at the bottom of the opening part, the thickness of a portion of the metal layer below the protruding end part of the glass cloth may become thin due to the presence of the protruding end part of the glass cloth. Third, using the laser processing method to form the opening part may cause residual resin to remain on the surface of the wiring layer exposed at the bottom of the opening part. Although a desmear process is performed for removing the residual resin, etching liquid used in the desmear process may melt a portion of the wiring layer and may cause hollowing. Further, because the resin of the insulation layer is etched by the desmear process, the end part of the glass cloth may further protrude toward the opening part. Thus, the protruding end part of the glass cloth may adversely affect a subsequent plating process (e.g., generation of voids).

[Method for Manufacturing Wiring Substrate According to Third Embodiment]

Figure 15:
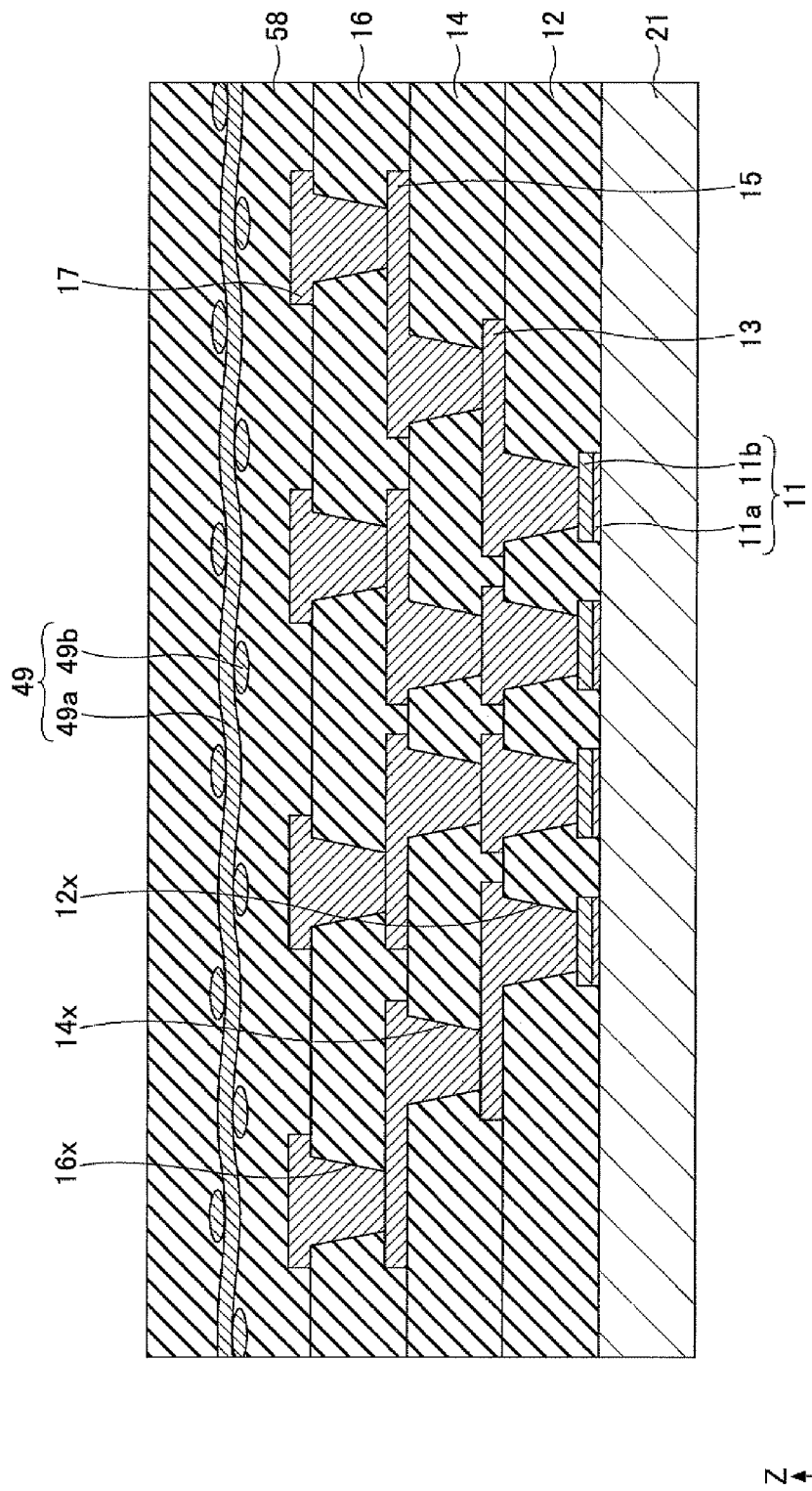
FIG. 15 is a schematic diagram illustrating a process of a wiring substrate manufacturing method according to the third embodiment of the present invention (part 1)
Figure 16:
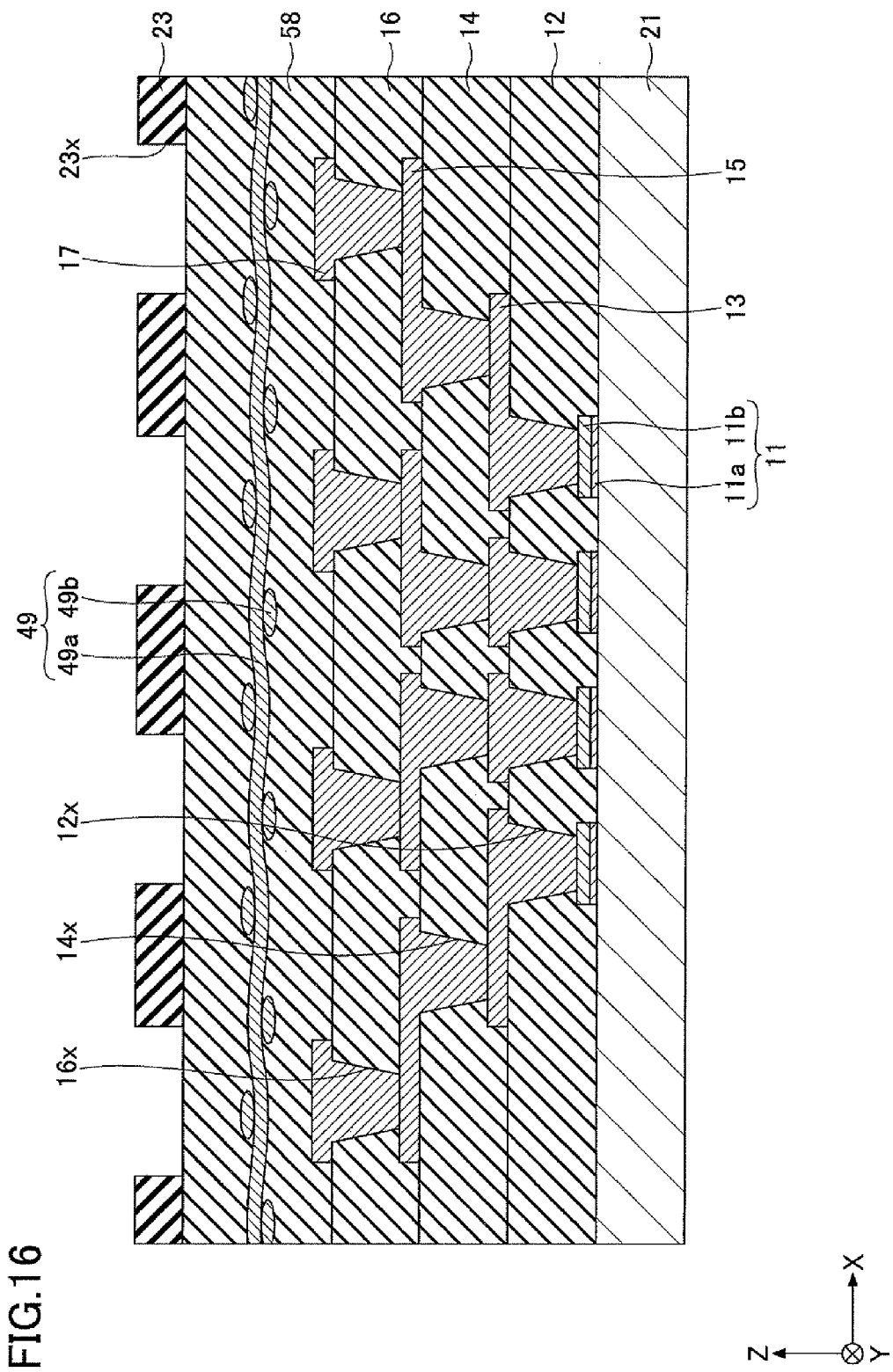
FIG. 16 is a schematic diagram illustrating a process of a wiring substrate manufacturing method according to the third embodiment of the present invention (part 2)
Figure 17:
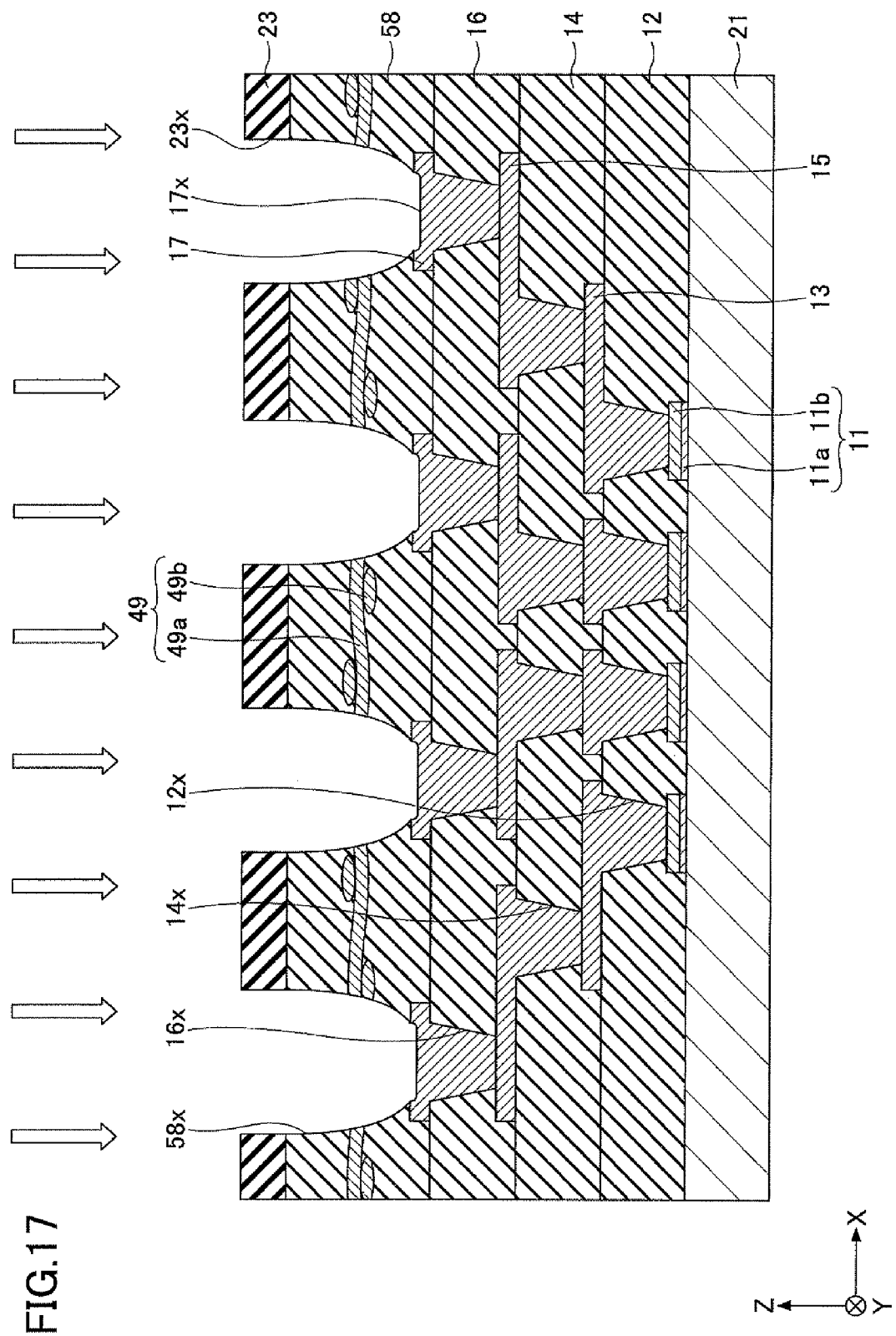
FIG. 17 is a schematic diagram illustrating a process of a wiring substrate manufacturing method according to the third embodiment of the present invention (part 3)

Next, a method for manufacturing a wiring substrate according to a third embodiment of the present invention is described. FIG. 15 to FIG. 17 illustrate the processes for manufacturing a wiring substrate according to the third embodiment.

First, by performing the same processes performed in FIGS. 3 to 9, the second insulation layer 14, the third wiring layer 15, the third insulation layer 16, and the fourth wiring layer 17 are stacked on the first insulation layer 12, as illustrated in FIG. 15. Then, the fourth insulation layer 58 is formed on the third insulation layer 16 in a manner covering the fourth wiring layer 17. As described above, the fourth insulation layer 58 includes, for example, an insulation resin impregnating a glass cloth 49. The insulation resin impregnating in the glass cloth 49 mainly includes, for example, an epoxy resin and has a non-photosensitive property. For example, the fourth insulation layer 58 may be formed by stacking a resin film (pre-preg) having the non-photosensitive impregnating insulation resin therein on the third insulation layer 16 and thermosetting (e.g., applying pressure to the resin film and heating the resin film) the resin film.

Accordingly, a predetermined built-up wiring layer configuration can be formed on the first surface of the substrate 21. In this embodiment, although the above-described built-up layer configuration is formed having 3 layers (i.e. the second, third, and fourth wiring layers 13, 15, 17), a built-up wiring layer configuration having n layers (n being an integer equal to or more than 1) may be formed.

Then, the resist layer 23 including opening parts 23x is formed on the fourth insulation layer 58 as illustrated in FIG. 16. More specifically, a liquid-like or a paste-like resist material including a photo-sensitive resin composition (e.g., epoxy resins, imide resins) is applied to the fourth insulation layer 58. Alternatively, a film-like resin material including a photo-sensitive resin composition (e.g., epoxy resins, imide resins) may be laminated onto the fourth insulation layer 58. Then, the opening parts 23x are formed by performing an exposing process and a developing process on the fourth insulation layer 58 applied with or laminated with the resin material. Thereby, the resist layer 23 including the opening parts 23x can be obtained. Alternatively, a film-like resin material formed with opening parts 23x beforehand may be laminated onto the fourth insulation layer 58.

The positions in which the opening parts 23x are formed correspond to the below-described positions of the opening parts 58x to be formed in the step illustrated in FIG. 17. The pitch between the opening parts 23x may range from, for example, approximately 500 μm to 1200 μm. The plan shape of the opening parts 23x may be, for example, a circle. The diameter of the circle may range from, for example, approximately 220 μm to 1100 μm.

Although the resist layer 23 acts as a mask for performing the below-described blasting method illustrated in FIG. 17, a portion of the surface of the resist layer 23 may be removed due to the blasting method. Therefore, it is preferable for the resist layer 23 to have a thickness sufficient to act as a mask even where a portion of the resist layer 23 is removed by the blasting method. The thickness of the resist layer 23 may be, for example, approximately 50 μm.

Then, the blasting method is performed in the arrow direction illustrated in FIG. 17 where the resist layer 23 is used as a mask. Thereby, the opening parts 58x are formed in the fourth insulation layer 58 at which the upper surface of the fourth wiring layer 17 becomes exposed. Then, by continuing the blasting method, the concave parts 17x are formed at the bottom parts of the opening parts 58x of the fourth insulation layer 58. Hence, by continuing the blasting method so that the concave parts 17x are formed at the exposed parts at the bottom parts of the opening parts, residual material (e.g., residual resin) of the fourth insulation layer 58 can be prevented from remaining inside the opening parts 58x.

By forming a pad (e.g. a receiving pad of the opening part 58x) having a larger diameter than the diameter of the bottom of the opening part 58x at a position of the fourth wiring layer 17 corresponding to the opening part 58x, an abrasive material used when forming the opening part 58x with the blasting process is received by the pad in the fourth wiring layer 17. Thereby, the third insulation layer 16 can be prevented from being polished.

The opening part 58x and the concave part 17x formed by the blasting process are formed into the above-described shapes as illustrated in FIG. 14. Accordingly, the fourth insulation layer 58 including the opening parts 58x and the concave parts 17x exposed at the bottom parts of the opening parts 58x can be obtained. The concave parts 17x formed in the fourth wiring layer 17 act as electrode pads to be connected to a mounting substrate (not illustrated) such as a motherboard.

The blasting process is a method for mechanically adjusting the surface roughness of a target object by applying an abrasive material against the surface of the target object under high pressure. The blasting process includes, for example, an air blasting process, a shot blasting process, or a wet blasting process. It is, however, preferable to use the wet blasting process which disperses an abrasive material (e.g., alumina abrasive grains, silica abrasive grains) in a solution (e.g., water) and applies the solution to the surface of the target object.

The wet blasting process is preferred because the wet blasting process is capable of polishing extremely fine areas without damaging the target object compared to the air blasting process or the shot blasting process. Further, because the wet blasting process uses a solution having an abrasive material dispersed therein, the wet blasting process can prevent particles of abrasive material from scattering in the air unlike the air blasting process or the shot blasting process.

The particle diameter of the abrasive material (e.g., alumina abrasive grains, silica abrasive grains) used in the wet blasting process ranges from, for example, approximately 5 μm to 20 μm. The concentration of the solution (e.g., water) having the abrasive material (e.g., alumina abrasive grains, silica abrasive grains) dispersed therein may be, for example, approximately 14 vol %. Further, the pressure for applying the solution containing the dispersed abrasive material to the surface of the target object is, for example, approximately 0.25 MPa.

The surface roughness of the sidewall 58s of the opening part 58x ranges from, for example, approximately Ra 150 nm to 600 nm whereas the surface roughness of the upper surface of the fourth insulation layer 58 except for the portion corresponding to the opening part 58x ranges from, for example, approximately Ra 150 nm or less. This is because the upper surface of the fourth insulation layer 58 is masked by the resist layer 23 during the blasting process and the abrasive material used in the blasting process does not contact the upper surface of the fourth insulation layer 58 except for the portion corresponding to the opening part 58x. Accordingly, only the sidewall 58s of the opening part 58x is subjected to roughening whereas the upper surface of the fourth insulation layer 58 except for the portion corresponding to the opening part 58x is not subjected to roughening. In a case where a laser processing method is used for forming the opening part 58x, the sidewall 58s of the opening part 58x and the upper surface of the fourth insulation layer 58 are etched in a desmear process. In this case, the surface roughness of the sidewall 58s of the opening part 58x and the surface roughness of the upper surface of the fourth insulation layer are both approximately Ra 500 nm.

According to necessity, a metal layer, for example, may be formed on the concave parts 17x of the fourth wiring layer 17 exposed at the bottom of the opening parts 58x. The metal layer may be formed by using, for example, an electroless plating method. The metal layer may be, for example, an Au layer, a Ni/Au layer (i.e., a metal layer including a Ni layer and a Au layer stacked one on top of the other in this order), or a Ni/Pd/Au layer (i.e., a metal layer including a Ni layer, a Pd layer, and a Au layer stacked one on top of the other in this order). The metal layer may be formed after the resist layer 23 is removed.

If the surface roughness of the upper surface of the fourth insulation layer 58 is high (e.g., approximately Ra 500 nm) as in the above-described case of forming the opening part 58x with a laser processing method and performing the desmear process, the metal layer may adhere (abnormal deposition) to the upper surface of the fourth insulation layer 58 when forming the metal layer with an electroless plating process. On the other hand, because the desmear process is not required in the case of forming the opening part 58x with the blasting process, the surface roughness of the upper surface of the fourth insulation layer 58 can be lower (e.g., approximately Ra 150 nm or less).

Further, in a case of forming, for example, a solder member (e.g., solder ball, solder bump) inside the opening part 58x for electrically connecting to the fourth wiring layer 17, the adhesiveness between the sidewall 58s of the opening part 58x and the solder member can be increased owing to the high surface roughness of the sidewall 58s of the opening part 58x (e.g., approximately Ra 150 nm to 600 nm).

Then, after performing the process illustrated in FIG. 17, the resist layer 23 is removed. Then, by removing the substrate 21, the wiring substrate 50 illustrated in FIG. 13 is obtained. The substrate 21, which is formed of copper foil, may be removed by a wet-etching method using a solution such as an iron (II) chloride solution, a copper (II) chloride, or an ammonium persulfate solution. In this case of removing the substrate 21, only the substrate 21 formed of copper foil can be selectively etched because the outermost layer of the first wiring layer 11 exposed at the first insulation layer 12 is, for example, a gold (Au) film. However, in a case where the fourth wiring layer 17 is formed of copper (Cu), the concave part 17x exposed at the bottom part of the opening part 58x is to be covered with a mask for preventing the concave part 17x from being etched together with the substrate 21.

Although FIGS. 15-17 illustrate an example of forming a single wiring substrate 50 on the substrate 21, plural wiring substrates 50 may be formed on the substrate 21 so that the plural substrates 50 can be obtained by dicing the substrate 21 into separate independent wiring substrates 50. Further, after or before the removal of the substrate 21, external connection terminals such as solder balls or lead pins may be formed on, for example, the concave parts 17x exposed at the bottom parts of the opening parts 58x.

Hence, the wiring substrate according to the above-described third embodiment is also manufactured so that all of the insulation layers (including the uppermost insulation layer) have substantially the same insulation resin including substantially the same composition and non-photosensitive property, have fillers of substantially the same composition and amount ranging from approximately 30 vol % or more to 65 vol % or less, and exhibit a thermal expansion coefficient ranging from approximately 12 ppm/° C. or more to 35 ppm/° C. or less. In addition, a reinforcement member (e.g., glass cloth) is provided in the uppermost insulation layer (fourth insulation layer) toward the external connection terminal side of the wiring substrate. Accordingly, the rigidity of the fourth insulation layer can be increased. Thus, warping of the wiring substrate can be further reduced compared to the wiring substrate of the first embodiment. By providing the reinforcement member (e.g., glass cloth) in the uppermost insulation layer (fourth insulation layer) toward the external connection terminal side (the side which warps in a concave manner) of the wiring substrate or providing the reinforcement member (e.g., glass cloth) in the insulation layer (third insulation layer) below and adjacent to the uppermost insulation layer, significantly effective resistance against the force causing the warping of the wiring substrate can be achieved. Thus, the warping of the wiring substrate can be further reduced.

Further, even in a case where the temperature of the wiring substrate is increased to a temperature surpassing the glass-transition temperature of the insulation resin in each of its insulation layers, the rigidity of the reinforcement member (e.g., glass cloth) restrains the warping of the wiring substrate. Therefore, steady behavior can be maintained even where the wiring substrate is placed in a high temperature atmosphere.

Further, because the opening part of the uppermost insulation layer is formed by performing the blasting process, the opening part becomes wider from the wiring layer side of the opening part toward the open end (upper surface side of uppermost insulation layer) of the opening part. The cross section of the sidewall of the opening part according to the above-described embodiment of the present invention has a concave R (round) shape. In a related art example, the cross section of a sidewall of an opening part has a straight shape that is substantially perpendicular to the upper surface of the wiring layer exposed at the bottom of the opening part. Thus, if the area of the upper surface of the wiring layer exposed at the bottom of the opening part according to the above-described embodiment of the present invention is the same as the area of the upper surface of the wiring layer exposed at the bottom of the opening part according to the related art example are substantially the same, the cross-section of the opening part of the uppermost insulation layer has an area (size) larger than that of the cross-section of the opening part of the uppermost insulation layer of the related art example owing to the concave R shape of the sidewall of the opening part. As a result, a pin of the so-called LGA (Land Grid Array) socket can be inserted into the opening part according to the above-described embodiment of the present invention more easily compared to the opening part of the related art example. Accordingly, insufficient insertion or insufficient contact of the pin of the LGA socket can be prevented.

Further, because the opening part of the uppermost insulation part is formed by performing the blasting process, there is no need to perform a desmear process. Thus, haloing (fracturing) can be prevented from occurring. As a result, insufficient adhesion between the wiring layer in the vicinity of the opening part and the insulation layer covering the opening part can be prevented.

Further, because the concave part is formed by performing the blasting process on the wiring layer exposed at the bottom of the opening part of the uppermost insulation layer, the bottom surface of the concave part is not formed on the same plane as the interface between the wiring layer located in the vicinity of the opening part and the insulation layer covering the wiring layer but is formed below the interface between the wiring layer located in the vicinity of the opening part and the insulation layer covering the wiring layer. Therefore, pressure can be prevented from being directly applied from a pin of the so-called LGA (Land Grid Array) socket to the interface between the wiring layer located in the vicinity of the opening part and the insulation layer covering the wiring layer. Accordingly, the wiring layer located in the vicinity of the opening part and the insulation layer covering the wiring layer can be prevented from separating from each other at the interface.

Further, in a case where, for example, a solder member (e.g., a solder ball or solder bump) is formed inside the opening part of the uppermost insulation layer, the adhesiveness between the sidewall of the opening part and the solder member can be increased by an anchor effect because only the sidewall portion of the opening part can be roughened by using a predetermined mask in the blasting process. Further, in a case of, for example, forming a metal layer on the wiring layer exposed at the bottom of the opening part of the uppermost insulation layer, the metal layer can be prevented from adhering (abnormal deposition) to the upper surface of the uppermost insulation layer because the portion of the upper surface of the uppermost insulation layer being covered by the predetermined mask is not roughened during the blasting process.

(Fourth Embodiment)

Next, a semiconductor package 70 according to the fourth embodiment of the present invention is described. The semiconductor package 70 according to the fourth embodiment includes the above-described wiring substrate 10 of the first embodiment having a semiconductor chip 71 mounted thereon. In the description of the fourth embodiment, like components are denoted with like reference numerals as those of the first embodiment and are not further described.

[Configuration of Semiconductor Package According to Fourth Embodiment]

Figure 18:
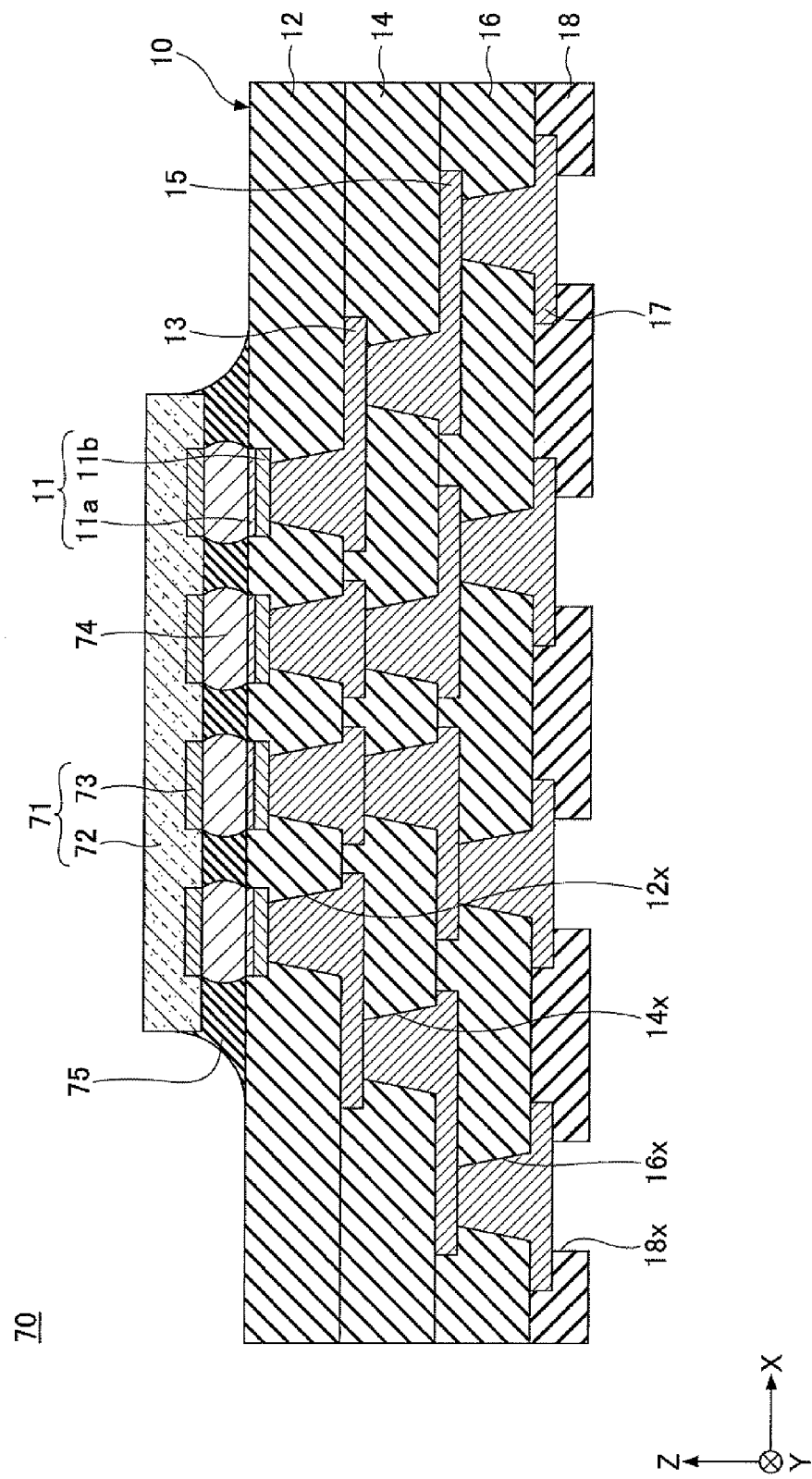
FIG. 18 is a cross-sectional view illustrating a semiconductor package according to a fourth embodiment of the present invention.

FIG. 18 is a cross-sectional view illustrating the semiconductor package according to the fourth embodiment. With reference to FIG. 18, the semiconductor package 70 includes the wiring substrate 10, the semiconductor chip 71, bumps 74, and underfill resin 75. In FIG. 18, the wiring substrate 10 is illustrated upside down with respect to the wiring substrate 10 illustrated in FIG. 2.

The semiconductor chip 71 includes a main body 72 and electrode pads 73 formed in the main body 72. The main body 72 includes a semiconductor integrated circuit (not illustrated) formed on a thin semiconductor substrate (not illustrated) formed of silicon or the like. The electrode pads 73 are electrically connected to the semiconductor integrated circuit (not illustrated). The material of the electrode pads 73 may be, for example, aluminum (Al).

The bumps 74 are electrically connected to the electrode pads 73 of the semiconductor chip 71 and a first wiring layer 11 (first layer 11a) exposed at the first insulation layer 12 of the wiring substrate 10. The bumps 74 may be, for example, solder bumps. The material of the solder bumps may be, for example, an alloy including lead (Pb), an alloy including tin (Sn) and copper (Cu), or an alloy including tin (Sn), silver (Ag), and copper (Cu). The underfill resin 75 is supplied in the space between the semiconductor chip 71 and the first surface of the wiring substrate 10.

Accordingly, with the above-described fourth embodiment of the present invention, a semiconductor package including a semiconductor chip mounted on the wiring substrate of the first embodiment can be obtained. That is, a semiconductor chip capable of undergoing reduced warping can be obtained.

In a case where the side of the wiring substrate 10 at which the first electrode pads 11z of the first wiring layer 11 are formed corresponds to the external connection terminal mounting side and the side of the wiring substrate 10 at which the second electrode pads 17z of the fourth wiring layer 17 are formed corresponds to the semiconductor chip mounting side, the semiconductor package may have the semiconductor chip mounted on the side of the wiring substrate 10 at which the second electrode pads 17z are formed. Alternatively, the above-described semiconductor package can be obtained even in a case of using the wiring substrate of the second embodiment (see, for example, FIG. 11) or the wiring substrate of the third embodiment (see, for example, FIG. 13).
(Simulation of Warping)

FIRST-FOURTH EXAMPLES

A simulation for observing warping was conducted on a wiring substrate A including ten insulation layers and ten wiring layers in which six insulation layers and six wiring layers are provided between the first and second insulation layers 12, 14 of the wiring substrate 10 illustrated in FIG. 2.

As for the conditions of the simulation, the wiring substrate A had a flat rectangular shape with a size of 45 mm×45 mm and a thickness of 500 μm. It is to be noted that the thickness of each insulation layer refers to a thickness of an insulation layer measured from an upper surface of a wiring layer beneath the insulation layer to an upper surface of the insulation layer covering the wiring layer. Accordingly, the total thickness of the wiring substrate A (i.e. 500 μm) is equivalent to the thickness of all of the insulation layers and the thickness of all of the wiring layers of the wiring substrate A.

Further, the material of each insulation layer of the wiring substrate A was an insulation resin that mainly includes an epoxy resin and has a non-photosensitive property. A filler of substantially the same composition and same amount was contained in each insulation layer of the wiring substrate A. The thermal expansion coefficient of each insulation layer of the wiring substrate A was adjusted to so that the insulation layers of the wiring substrate A have substantially the same thermal expansion coefficient. The material of each wiring layer of the wiring substrate A was copper (Cu).

As illustrated in FIG. 20, with the wiring substrate A according to a first example, the thermal expansion coefficient of the wiring substrate A was adjusted to approximately 35 ppm/° C. by forming each of the insulation layers with a filler content of 30 vol %. With the wiring substrate A according to a second example, the thermal expansion coefficient of the wiring substrate A was adjusted to approximately 25 ppm/° C. by forming each of the insulation layers with a filler content of 45 vol %. With the wiring substrate A according to a third example, the thermal expansion coefficient of the wiring substrate A was adjusted to approximately 17 ppm/° C. by forming each of the insulation layers with a filler content of 55 vol %. With the wiring substrate A according to a fourth example, the thermal expansion coefficient of the wiring substrate A was adjusted to approximately 12 ppm/° C. by forming each of the insulation layers with a filler content of 65 vol %.

FIRST COMPARATIVE EXAMPLE

With the wiring substrate A according to a first comparative example having the same structure as that of the first-fourth examples, the thermal expansion coefficient of the wiring substrate A was adjusted to approximately 45 ppm/° C. by forming each of the insulation layers with a filler content of 23 vol %.

SECOND COMPARATIVE EXAMPLE

With a wiring substrate A according to a second comparative example, the uppermost insulation layer toward the external connection terminal side of the wiring substrate A was formed with insulation resin mainly including an epoxy resin and having a photosensitive property (thermal expansion coefficient 60-65 ppm/° C.) whereas the other insulation layers of the wiring substrate A were formed with a thermal expansion coefficient of approximately 45 ppm/° C. by forming each of the other insulation layers with a filler content of 23 vol %.
[Simulation Results]

Figure 19A:
FIG. 19A is a schematic diagram for describing the direction of warping of a wiring substrate (part 1)
Figure 19B:
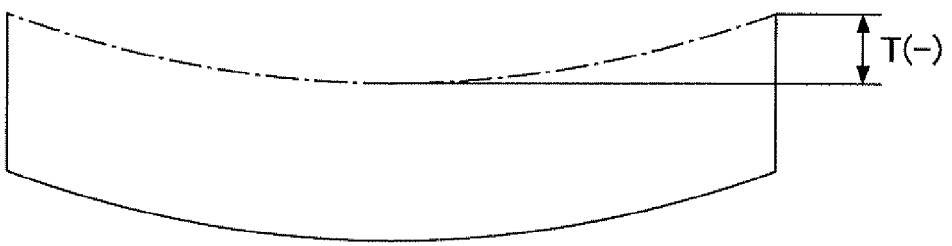
FIG. 19B is a schematic diagram for describing the direction of warping of a wiring substrate (part 2)

FIGS. 19A and 19B are schematic diagrams for describing the direction of warping of the wiring substrate A. In FIGS. 19A and 19B, the dash dot line indicates the semiconductor chip mounting side (surface) of the wiring substrate A. As illustrated in FIG. 19A, in a case where the semiconductor chip mounting side of the wiring substrate A warps in a convex manner, the amount of warping (warping amount) T is indicated with a positive sign. As illustrated in FIG. 19B, in a case where the semiconductor chip mounting side of the wiring substrate A warps in a concave manner, the amount of warping (warping amount) T is indicated with a negative sign.

The results of the simulation are illustrated in FIG. 20.

In the table illustrated in FIG. 20, the simulation was performed by adjusting the thermal expansion coefficients of the wiring substrates A of the first-fourth examples in a range from 12 ppm/° C. or more to 35 ppm/° C. or less by setting the filler content of the insulation layers in a range from 30 vol % or more to 65 vol % or less. The simulation results of the first-fourth example indicate that the amount of warping T can be reduced compared to the first and second comparative examples. Particularly, in a case where the thermal expansion coefficient was adjusted in the range of 12 ppm/° C. or more to 17 ppm/° C. or less (i.e. third and fourth examples) by forming the insulation layers with a filler content ranging from 55 vol % or more to 65 vol % or less, the amount of warping T can be significantly reduced compared to the first and second examples.

In the table of FIG. 20, the column of "warping image" illustrates the warping of the wiring substrate A in a state where the semiconductor chip mounting side is positioned facing upward. As illustrated in the column of "warping image" and the column of "warping amount", the semiconductor chip mounting side warps in a concave manner (negative (−) warping amount T) in a case where the filler content is low and the thermal expansion coefficient is high. The amount of warping becomes closer toward zero as the amount of filler (filler content) is increased and the thermal expansion coefficient is reduced. As the amount of filler is further increased and the thermal expansion coefficient is further reduced, the semiconductor chip mounting side warps in a convex manner (positive (+) warping amount T).

Further, by providing a reinforcement member (e.g., glass cloth) in the uppermost insulation layer toward the external connection terminal side of the wiring substrate A or the insulation layer adjacent to and below the uppermost insulation layer toward the external connection terminal side of the wiring substrate A according to the first-fourth examples, the amount of warping T illustrated in FIG. 20 can be further reduced.

In the above-described embodiments of the present invention, the term "uppermost insulation layer" indicates an insulation layer positioned nearest to one of the first and second main surfaces of the wiring substrate whereas the term "lowest insulation layer" indicates an insulation layer positioned nearest to the other of the first and second main surfaces of the wiring substrate.

The wiring substrate (coreless wiring substrate) according to the above-described embodiments of the present invention is manufactured by stacking wiring layers and insulation layers on one side (one surface of the first and second surfaces) of a substrate by using a build-up method and then removing the substrate at the end of the manufacturing process. In an alternative example, the wiring substrate (careless wiring substrate) may be manufactured by stacking wiring layers and insulation layers on both sides (first and second surfaces) of the substrate and then removing the substrate at the end of the manufacturing process. In the alternative example, the wiring layers and the insulation layers are successively stacked on the first and second surfaces of the substrate from the semiconductor chip mounting side and then the substrate is removed at the end of the manufacturing method.

It is to be noted that the number of insulation layers or the number of wiring layers are not limited to those of the above-described embodiments of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A wiring substrate comprising:
   a plurality of wiring layers and a plurality of insulation layers being alternately stacked one on top of the other;
   a first main surface; and
   a second main surface that is positioned on a side opposite of the first main surface;
   wherein the plurality of insulation layers include
      an insulation layer being positioned nearest to the second main surface among the plurality of insulation layers, the insulation layer including a plurality of opening parts and a reinforcement member,
   wherein the plurality of wiring layers include
      a plurality of first electrode pads that are exposed toward the first main surface,
      a plurality of second electrode pads that are formed in the plurality of opening parts and exposed toward the second main surface,
   wherein a pitch between the plural second electrode pads is greater than a pitch between the plural first electrode pads,
   wherein the plurality of insulation layers are formed with an insulation resin having the same composition,
   wherein the plurality of insulation layers are formed with a filler having the same composition,
   wherein the filler content of each of the plurality of insulation layers ranges from 30 vol % or more to 65 vol % or less, and
   wherein the thermal expansion coefficient of each of the plurality of insulation layers ranges from 12 ppm/° C. or more to 35 ppm/° C. or less.

2. The wiring substrate as claimed in claim 1, wherein the filler content of each of the plurality of insulation layers ranges from 55 vol % or more to 65 vol % or less, wherein the thermal expansion coefficient of each of the plurality of insulation layers ranges from 12 ppm/° C. or more to 17 ppm/° C. or less.

3. The wiring substrate as claimed in claim 1, wherein the reinforcement member includes fiber bundles that are woven into a lattice-like configuration.

4. The wiring substrate as claimed in claim 1, wherein a sidewall of each of the plurality of opening parts includes a cross section having a concave round shape, wherein the plurality of opening parts include a concave part formed in the plurality of second electrode pads exposed at bottom parts of the plurality of opening parts.

5. The wiring substrate as claimed in claim 4, wherein a sidewall of the concave part has an outermost edge part that matches an innermost edge part of the sidewall of each of the plurality of opening parts.

6. The wiring substrate as claimed in claim 4, wherein the sidewall of each of the plurality of opening parts has a surface roughness that is greater than a surface roughness of an upper surface of the insulation layer.

7. A semiconductor package comprising:
   a wiring substrate; and
   a semiconductor chip mounted on the wiring substrate via a plurality of bumps;
   wherein the wiring substrate includes
      a plurality of wiring layers and a plurality of insulation layers being alternately stacked one on top of the other;
   a first main surface; and
   a second main surface that is positioned on a side opposite of the first main surface;
   wherein the plurality of insulation layers include
      an insulation layer being positioned nearest to the second main surface among the plurality of insulation layers, the insulation layer including a plurality of opening parts and a reinforcement member,
   wherein the plurality of wiring layers include
      a plurality of first electrode pads that are exposed toward the first main surface,
      a plurality of second electrode pads that are formed in the plurality of opening parts and exposed toward the second main surface,
   wherein a pitch between the plural second electrode pads is greater than a pitch between the plural first electrode pads, wherein the plurality of insulation layers are formed with an insulation resin having the same composition, wherein the plurality of insulation layers are formed with a filler having the same composition, wherein the filler content of each of the plurality of insulation layers ranges from 30 vol % or more to 65 vol % or less, and wherein the thermal expansion coefficient of each of the plurality of insulation layers ranges from 12 ppm/° C. or more to 35 ppm/° C. or less.

8. A wiring substrate comprising:

a plurality of wiring layers and a plurality of insulation layers being alternately stacked one on top of the other;

a first main surface; and a second main surface that is positioned on a side opposite of the first main surface;

wherein the plurality of insulation layers include
one insulation layer being positioned nearest to the second main surface among the plurality of insulation layers and including a plurality of opening parts,
another insulation layer being positioned nearer to the first main surface than the one insulation layer and including a reinforcement member;

wherein the plurality of wiring layers include
a plurality of first electrode pads that are exposed toward the first main surface, and
a plurality of second electrode pads that are formed in the plurality of opening parts and exposed toward the second main surface;

wherein a pitch between the plurality of second electrode pads is greater than a pitch between the plurality of first electrode pads, wherein the plurality of insulation layers are formed with an insulation resin having the same composition, wherein the plurality of insulation layers are formed with a filler having the same composition, wherein the filler content of each of the plurality of insulation layers ranges from 30 vol % or more to 65 vol % or less, and wherein the thermal expansion coefficient of each of the plurality of insulation layers ranges from 12 ppm/° C. or more to 35 ppm/° C. or less.

9. The wiring substrate as claimed in claim 8, wherein the filler content of each of the plurality of insulation layers ranges from 55 vol % or more to 65 vol % or less, wherein the thermal expansion coefficient of each of the plurality of insulation layers ranges from 12 ppm/° C. or more to 17 ppm/° C. or less.

10. The wiring substrate as claimed in claim 8, wherein the reinforcement member includes fiber bundles that are woven into a lattice-like configuration.

11. The wiring substrate as claimed in claim 8, wherein a sidewall of each of the plurality of opening parts includes a cross section having a concave round shape, wherein the plurality of opening parts include a concave part formed in the plurality of second electrode pads exposed at bottom parts of the plurality of opening parts.

12. The wiring substrate as claimed in claim 11, wherein a sidewall of the concave part has an outermost edge part that matches an innermost edge part of the sidewall of each of the plurality of opening parts.

13. The wiring substrate as claimed in claim 11, wherein the sidewall of each of the plurality of opening parts has a surface roughness that is greater than a surface roughness of an upper surface of the one insulation layer.

14. A semiconductor package comprising:

a wiring substrate; and a semiconductor chip mounted on the wiring substrate via a plurality of bumps;

wherein the wiring substrate includes
a plurality of wiring layers and a plurality of insulation layers being alternately stacked one on top of the other;

a first main surface; and a second main surface that is positioned on a side opposite of the first main surface;

wherein the plurality of insulation layers include
one insulation layer being positioned nearest to the second main surface among the plurality of insulation layers and including a plurality of opening parts,
another insulation layer being positioned nearer to the first main surface than the one insulation layer and including a reinforcement member;

wherein the plurality of wiring layers include
a plurality of first electrode pads that are exposed toward the first main surface, and
a plurality of second electrode pads that are formed in the plurality of opening parts and exposed toward the second main surface;

wherein a pitch between the plurality of second electrode pads is greater than a pitch between the plurality of first electrode pads, wherein the plurality of insulation layers are formed with an insulation resin having the same composition, wherein the plurality of insulation layers are formed with a filler having the same composition, wherein the filler content of each of the plurality of insulation layers ranges from 30 vol % or more to 65 vol % or less, and wherein the thermal expansion coefficient of each of the plurality of insulation layers ranges from 12 ppm/° C. or more to 35 ppm/° C. or less.

* * * * *